United States Patent [19]

Suenaga et al.

[11] Patent Number: 5,668,673
[45] Date of Patent: Sep. 16, 1997

[54] CATADIOPTRIC REDUCTION PROJECTION OPTICAL SYSTEM

[75] Inventors: Yutaka Suenaga, Yokohama; Toshiro Ishiyama, Kawasaki; Yoshiyuki Shimizu, Miura; Kiyoshi Hayashi, Koganei, all of Japan

[73] Assignee: Nikon Corporation, Tokyo, Japan

[21] Appl. No.: 456,624

[22] Filed: Jun. 1, 1995

Related U.S. Application Data

[63] Continuation-in-part of Ser. No. 167,209, Dec. 16, 1993, abandoned, which is a continuation-in-part of Ser. No. 95,919, Jul. 23, 1993, abandoned, which is a continuation-in-part of Ser. No. 65,046, May 24, 1993, abandoned, which is a continuation of Ser. No. 918,763, Jul. 27, 1992, abandoned.

[30] Foreign Application Priority Data

| Aug. 5, 1991 | [JP] | Japan | 3-195500 |
| Jul. 29, 1992 | [JP] | Japan | 4-202359 |
| Dec. 24, 1992 | [JP] | Japan | 4-343976 |
| Nov. 16, 1993 | [JP] | Japan | 5-286516 |
| Jul. 7, 1994 | [JP] | Japan | 6-155799 |

[51] Int. Cl.$^6$ ............ G02B 17/00; G02B 21/00
[52] U.S. Cl. ............ 359/731; 359/364; 359/366; 359/727
[58] Field of Search ............ 359/364–366, 359/726–732, 857–863

[56] References Cited

U.S. PATENT DOCUMENTS

| 4,241,390 | 12/1980 | Markle et al. | 359/366 |
| 4,812,028 | 3/1989 | Matsumoto | 359/731 |
| 5,212,593 | 5/1993 | Williamson et al. | 359/727 |
| 5,220,454 | 6/1993 | Ichihara et al. | 359/727 |
| 5,251,070 | 10/1993 | Hashimoto et al. | 359/727 |
| 5,323,263 | 6/1994 | Schoenmakers | 359/365 |

FOREIGN PATENT DOCUMENTS

| 350955 | 1/1990 | European Pat. Off. | 359/366 |

*Primary Examiner*—Thong Nguyen
*Attorney, Agent, or Firm*—Shapiro and Shapiro

[57] ABSTRACT

A first partial optical system including a first group of lenses having a positive refractive power, a first concave reflection mirror and a second group of lenses having a positive refractive power, for forming a primary reduced image of an object, a second partial optical system including a second concave reelection mirror and a third group of lenses having a positive refractive power, for further reducing the primary reduced image and refocusing it, and a reflection mirror arranged between the first partial optical system and the second partial optical system, for deflecting a light path are arranged in a sequence as viewed from the object. A good image-forming ability as a projection optical system for fabricating a semiconductor device is attained with a simple construction.

28 Claims, 26 Drawing Sheets

COMA

COMA

COMA

COMA

COMA

COMA

COMA

FIG. 22

COMA IN SAGITTAL DIRECTION 0.002

-0.002

COMA IN MERIDIONAL DIRECTION 0.002

-0.002

- - - - 213.0 NM
——— 217.0 NM
- - - - 221.0 NM

CATADIOPTRIC REDUCTION PROJECTION OPTICAL SYSTEM

This application is a continuation-in-part of application Ser. No. 08/167,209 filed Dec. 16, 1993, (abandoned), which is a continuation-in-part of application Ser. No. 08/095,919 filed Jul. 23, 1993 (abandoned), which is a continuation-in-part of application Ser. No. 08/065,046 filed May 24, 1993 (abandoned), which is a continuation of application Ser. No. 07/918,763 filed Jul. 27, 1992 (abandoned).

BACKGROUND OF THE INVENTION

1. Field of the Invention

The present invention relates to a catadioptric optical system having a reflection surface and a refraction surface, and more particularly to an image forming optical system for reduction projection.

2. Related Background Art

Various optical systems for projecting and exposing a mask pattern onto a photoresist on a wafer to manufacture an integrated circuit such as an LSI have been proposed. It is known that an aberration is well corrected at a relatively large aperture in a Dyson type catadioptric optical system. However, since a focusing magnification in the Dyson type catadioptric optical system is unity, there is a limit in the transfer of a fine pattern.

As an optical system having a reduction factor suitable for the manufacture of a semiconductor device having a finer pattern, an optical system which is a modification of the Dyson type catadioptric optical system is disclosed U.S. Pat. No. 4,747,678 and U.S. Pat. No. 4,953,960.

The optical system disclosed in U.S. Pat. No. 4,747,678 which permits the reduction projection allows the reduction focusing of a ring-shaped view field. Basically, it comprises three concave mirrors and a convex mirror and is used as a light exposure device for microlithography. Accordingly, it uses a very complex optical construction of a combination of a number of lenses.

The reduction projection optical system disclosed in U.S. Pat. No. 4,953,960 comprises a combination of a concave mirror and a lens system. Since the reduction is attained by one time of focusing, the aberration is large and a combination of a number of lenses is needed to correct the aberration. Since it is essential to provide a large scale beam splitter such as a half mirror in a light path, a loss of light intensity is more than 75% and the increase of exposure time due to the loss of light intensity causes a fatal shortcoming of the reduction of throughput in the manufacturing process of the semiconductor device. Further, a stray light which causes flare and ununiformity in illumination occurs in the large beam splitter in the light path, and it is difficult to manufacture a large semitransparent plane.

SUMMARY OF THE INVENTION

It is an object of the present invention to provide a reduction projection optical system which solves problems encountered in the prior art optical system and which is simple in structure and has a good image-forming ability as a projection optical system for use in semiconductor fabrication.

Other objects, features, and effects of the present invention will become apparent from the following detailed description taken in conjunction with the accompanying drawings.

BRIEF DESCRIPTION OF THE DRAWINGS

FIG. 22 is a graph showing the coma aberration of the 13th embodiment;

DETAILED DESCRIPTION OF THE PREFERRED EMBODIMENTS

Figure 1:
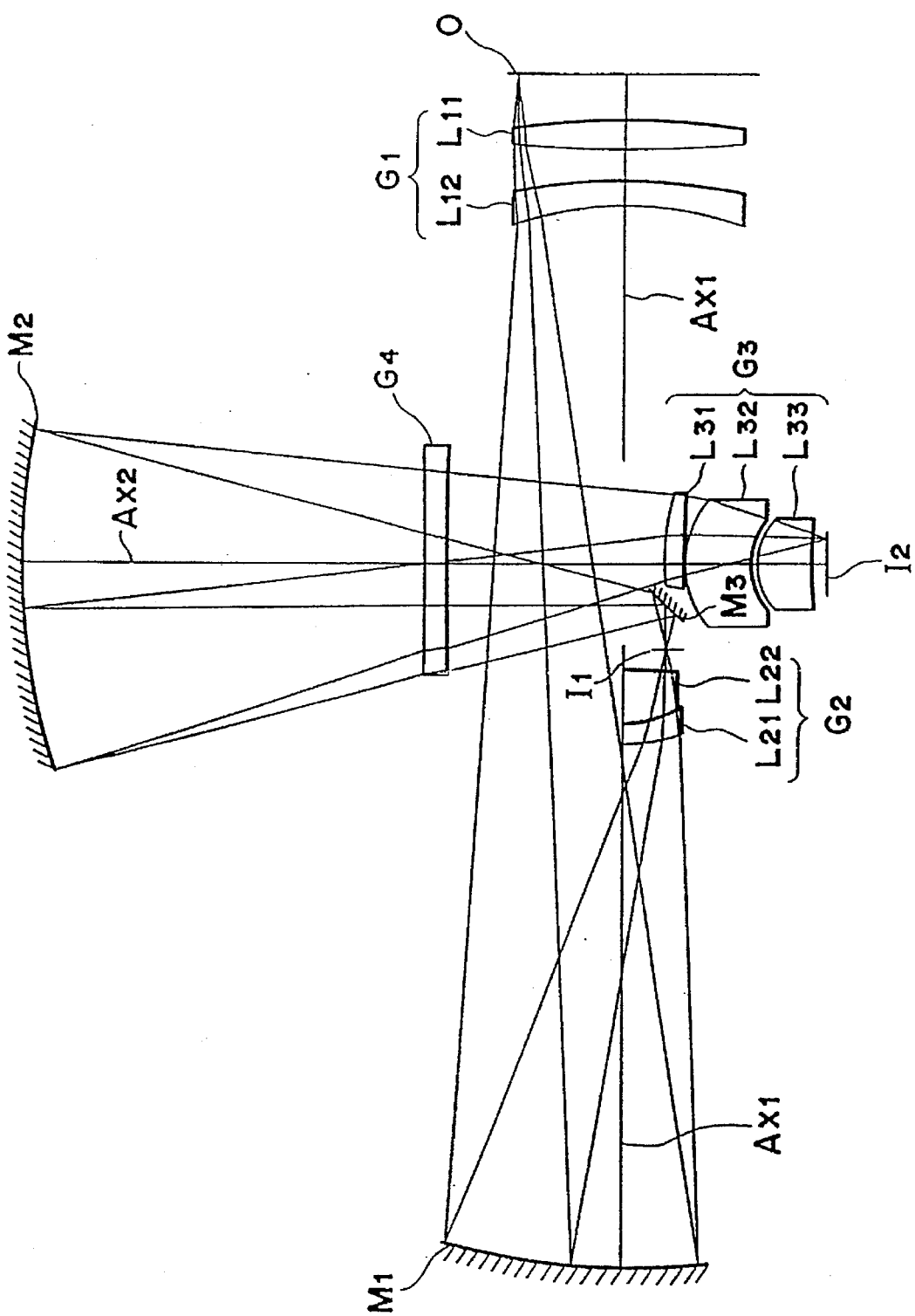
FIG. 1 shows a light path of a first embodiment of a catadioptric reduction projection optical system of the present invention.

A catadioptric reduction projection optical system according to the present invention has, in succession from the object side, a first partial optical system having a lens group $G_1$ of positive refractive power and a first concave reflecting mirror $M_1$ for forming the primary reduced image of an object, a second partial optical system having a second concave reflecting mirror $M_2$ and a lens group $G_3$ of positive refractive power for further reducing and re-imaging said primary reduced image, and a lens group $G_2$ disposed near said primary reduced image, and further has a reflecting mirror disposed in the optical path between said first concave reflecting mirror $M_1$ and said second concave reflecting mirror $M_2$ for bending the optical path.

In a catadioptric reduction projection optical according to the present invention as described above, the first and second partial optical systems have concave reflecting mirrors that provide considerable refractive power among the total positive refractive power of the entire optical system and a lens group of positive refractive power and both make reduction imaging possible and therefore, a predetermined reduction magnification can be obtained as a whole system without each partial optical system being made to bear a treat burden in aberration correction.

By the lens group $G_2$ being disposed near the primary reduced image $I_1$, it becomes possible to apply a reduction magnification more and correct off-axis aberrations better.

Where the lens group $G_2$ disposed near the primary reduced image $I_1$ is disposed at the first partial optical system side, it can be considered to be included in the first partial optical system, and where it is positive refractive power disposed immediately forwardly of the primary reduced image, it becomes possible to construct the whole optical system most simply. In this case, the catadioptric reduction projection optical system has, in succession from the object side, a first partial optical system having a first lens group $G_1$ of positive refractive power, a first concave reflecting mirror $M_1$ and a second lens group $G_2$ of positive refractive power and for forming the primary reduced image of an object, and a second partial optical system having a second concave reflecting mirror $M_2$ and a third lens group $G_3$ of positive refractive power and for further reducing and re-imaging said primary reduced image, and further has a reflecting mirror disposed in the optical path between the first partial optical system and the second partial optical system for bending the optical path.

In such a construction, the first and second partial optical systems have concave reflecting mirrors that provide considerable refractive power among the total positive refractive power of the entire optical system, and lens groups (a second lens group $G_2$ and a third lens group $G_3$) of positive refractive power near the image thereof, whereby both of them make reduction imaging possible and therefore, without each partial optical system being made to bear a great burden in aberration correction, it is possible to be simple in construction and yet maintain an excellent imaging performance.

Further, it is effective to make the construction of the first lens group $G_1$ into the so-called telephoto type comprising, in succession from the object side, a front group $G_{11}$ of positive refractive power and a rear group $G_{12}$ of negative refractive power. In this case, the reduction magnification in the first lens group $G_1$ can be earned and at the same time, the amount of aberration in the first concave reflecting mirror $M_1$ can be made small and therefore, it becomes unnecessary to obtain a reduction magnification by the second lens group $G_2$ and it becomes unnecessary to earn a reduction magnification by the second lens group $G_2$, and the second lens group $G_2$ can be used as a lens group exclusively foe aberration correction, and it becomes possible to endow it with a greater numerical aperture (N.A.). Accordingly, the second lens group $G_2$ can be made into not only a construction which, as described above, earns a reduction magnification with relatively strong refractive power immediately forwardly of the primary reduced image, but also a construction in which the second lens group $G_2$ is made to function as a lens group exclusively for aberration correction, near the primary reduced image.

Where each concave reflecting mirror is a spherical mirror, it is desirable that in the second partial optical system, a fourth lens group $G_4$ for aberration correction be disposed between the second concave mirror $M_2$ and the third lens group $G_3$. It is also effective to dispose, in the first partial optical system, a fifth lens group $G_5$ for aberration correction between the first lens group $G_1$ and the first concave reflecting mirror $M_1$.

In the manner described above, it is possible to be simple in optical construction and yet maintain an excellent imaging performance, and by having a great numerical aperture (N.A.), the transfer of more minute patterns is possible.

In addition, in an optical system according to the present invention, a plane reflecting mirror $M_3$ for bending the optical path is disposed in the optical path from-the first partial optical system to the second partial optical system, and preferably between the first concave reflecting mirror M1 and the second concave reflecting mirror $M_2$, whereby the optical path can be completely separated. Therefore, this reflecting mirror can be a total reflection mirror, and a beam splitter such as a half mirror is not required as is in the aforementioned U.S. Pat. No. 4,953,960. This leads to the advantage that the loss of the quantity of light is much smaller and the possibility of creating harmful stray light such as flare is little.

Also, in an optical system of the present invention, all of the optical members, except the plane reflecting mirror $M_3$ for bending the optical path, have centers of curvature on the same optical axis.

The essential difference of the construction of the present invention as described above from the optical system disclosed in the aforementioned U.S. Pat. No. 4,747,678 is that a convex reflecting mirror is not required as an optical element. This is because the above-described optical system according to the prior art has adopted a correcting technique whereby negative Petzval sum created by the Concave reflecting mirror is negated by the convex reflecting mirror and the refracting system effects auxiliary aberration correction, whereas the present invention adopts a correcting technique whereby negative Petzval sum created by the concave reflecting mirror is negated by positive Petzval sum in the third lens group $G_3$ which is a lens group of positive refractive power. Therefore, in the present invention, the positive refractive power of the third lens group $G_3$ is made considerably strong and is positively used. Where the second lens group $G_2$ is a lens group of positive refractive power disposed immediately forwardly of the primary reduced image $I_1$. It is possible to cause the second lens group $G_2$ to act in addition to the positive refractive power of the third lens group $G_3$, thereby enhancing the effect, Features of the present invention are now described in detail. The first and second partial optical systems are reduced image-forming systems as described above but the second concave reflection mirror $M_2$ in the second partial optical system preferably has a small magnification factor although it is close to unity magnification in order to facilitate the separation of the light path by the planar reflection mirror $M_3$. Specifically, it is preferable that the following condition is met:

$$-1.5 < \beta_{M2} < -1.0$$

where $\beta_{M2}$ is the magnification of the second concave reflection mirror $M_2$.

As a result, a position of an object image $I_1$ by the first partial optical system is closer to the second concave reflection mirror $M_2$ than a position of an image $I_2$ by the second partial optical system is so that the interference of the light path is prevented even for a light beam of a large numerical aperture. When $\beta_{M2}$ exceeds the upper limit, the magnification of the second concave reflection mirror exceeds unity and the separation of the light path is difficult to attain. Conversely, when the magnification exceeds the lower limit, it is difficult for the second partial optical system to attain the desired reduction factor, and the burden of the first partial optical system increases and a complex construction is required to correct the aberration.

The first concave reflection mirror $M_1$ has a relatively large reduction factor and plays an important role in balancing the compactness of the entire system and the correction of aberration. It is preferable to meet the following condition:

$$-0.7<\beta_{M1}<-0.3$$

where $\beta_{M1}$ is the magnification of the first concave reflection mirror $M_1$.

The balance of aberration of the groups of lenses is now discussed. The first group of lenses $G_1$ is arranged in the vicinity of the object surface and functions as a so-called view field lens and also corrects direction aberration. The second and third groups of lenses $G_2$ and $G_3$ have large positive refractive powers as described above, contribute to the formation of the reduced image and positively function to correct the Petzval sum, and the negative distortion aberration generated therein is corrected by the positive distortion aberration of the first group of lenses $G_1$. The fourth group of lenses $G_4$ provisionally arranged in the second partial optical system is effective to correct higher order spherical aberration. Where the concave reflection mirrors, particularly the first concave reflection mirror $M_1$ which shares a large portion of the reduction factor are non-spherical rather than spherical, the fourth group of lenses $G_4$ may be omitted.

A catadioptric reduction projection optical system according to the present invention has a first partial optical system including, in succession from the object side, a first lens group $G_1$ of positive refractive power and a first concave reflecting (or reflection) mirror $M_1$ for forming a primary reduced image of an object, and a second partial optical system including, in succession from the object side, a second concave reflection mirror $M_2$ and a third lens group $G_3$ of positive refractive power for re-imaging the primary reduced image, and a second lens group $G_2$ of positive or negative refractive power is arranged in the optical path (or light path) between the first and second concave reflection mirrors $M_1$ and $M_2$.

In a catadioptric reduction projection optical system according to the present invention with the above-mentioned construction, the first and second partial optical systems have concave reflection mirrors that provide considerable refractive power among the total positive refractive power of the entire optical system and a lens group (first or third lens group $G_1$ or $G_3$) of positive refractive power, and both make reduction imaging possible. Therefore, a predetermined reduction factor can be obtained as a whole system without forcing a partial optical system to bear a great burden in aberration correction. For this reason, it is possible to simplify the optical construction and yet maintain an excellent imaging performance.

The balance of aberration of the lens groups in a catadioptric reduction projection optical system according to the present invention will now be discussed. The first lens group $G_1$ is arranged in the vicinity of the object surface, has a function of maintaining telecentric characteristics, and corrects distortion. The second and third lens groups $G_2$ and $G_3$ contribute to formation of the reduced image and to correction of the Petzval sum. In particular, the second lens group $G_2$ functions as a so-called field lens, and allows a light beam from a position near the optical axis of the first concave reflection mirror $M_1$ to pass therethrough. Thus, the light beam through second concave mirror $M_2$ at a position near the optical axis and generation of aberration in the second concave reflection mirror $M_2$ can be prevented. The negative distortion generated in the second and third lens groups $G_2$ and $G_3$ is corrected by the positive distortion of the first lens group $G_1$. Lens groups (fourth and fifth lens groups $G_4$ and $G_5$) provisionally disposed in the vicinity of the concave reflection mirrors are effective to correct higher order spherical aberration generated by the concave reflection mirrors. When the concave reflection mirror is constituted to be a non-spherical mirror, since aberration generated by the concave reflection mirror is minimized, the fourth and fifth lens groups $G_4$ and $G_5$ may be omitted.

The characteristic features of the construction according to the present invention will be described in detail below.

It is preferable that a catadioptric reduction projection optical system according to the present invention be arranged to satisfy the following condition:

$$-2.5<\beta_{M2}<-0.7 \quad (1)$$

where $\beta_{M2}$ is the magnification of the second concave reflection mirror $M_2$. The condition (1) defines a preferable magnification of the second concave reflection mirror $M_2$. When $\beta_{M2}$ exceeds the upper limit of the condition (1), the refractive power of the concave reflection mirror $M_2$ increases, aberrations, especially spherical aberration and coma, generated by the concave reflection mirror $M_2$ increase, and it becomes difficult to satisfactorily correct the aberrations. Furthermore, a light beam propagating toward the concave reflection mirror $M_2$ considerably overlaps a light beam propagating from the concave reflection mirror $M_2$ toward the secondary image surface, and it becomes difficult to obtain a physically constructible optical system. When $\beta_{M2}$ is set below the lower limit, the refractive power of the concave reflection mirror $M_2$ decreases, and the decrease in refractive power must be compensated for by a refracting optical system, thus losing the merits of a reflecting optical system. At this time, the construction of the refracting optical system is more complicated, and aberration correction becomes harder to attain.

Furthermore, in order to facilitate separation of the light path by a planar reflection mirror (plane reflection mirror) in the catadioptric reduction projection optical system according to the present invention, it is further preferable to satisfy the following condition:

$$-1.5<\beta_{M2}<-1.0$$

where $\beta_{M2}$ is the magnification of the second concave reflection mirror $M_2$. Under this condition, when both the first and second optical systems are reduction imaging systems, since the position of an object image (primary image) $I_1$ formed by the first partial optical system becomes closer to the second concave reflection mirror $M_2$ than the position of an image $I_2$ formed by the second partial optical system, the interference of the light path can be prevented for a light beam of a large numerical aperture. When $\beta_{M2}$ exceeds the upper limit of this condition, since the magnification of the second concave reflection mirror $M_2$ exceeds unity, the separation of the light path may become difficult to attain. Conversely, when the magnification decreases beyond the lower limit of the condition, it is difficult for the second partial optical system to attain a desired reduction factor, and the burden of the first partial optical system increases, thus requiring a complicated construction for aberration correction.

It is preferable that a catadioptric reduction projection optical system according to the present invention be arranged to satisfy the following condition:

$$-2.0 < \beta_{M1} < -0.3 \qquad (2)$$

where $\beta_{M1}$ is the magnification of the first concave reflection mirror. This condition defines a proper magnification of the first concave reflection mirror $M_1$. When $\beta_{M1}$ exceeds the upper limit of the condition (2), the refractive power of the first concave reflection mirror $M_1$ increases, and aberrations, especially spherical aberration and coma, generated by the first concave reflection mirror $M_1$ increase. Thus, the negative refractive power of a refracting optical system must be strengthened to cancel these aberrations, and it becomes difficult to satisfactorily correct aberrations. When the magnification is set below the lower limit of the condition (2), the refractive power of the refracting optical system must be strengthened to compensate for the refractive power of the concave reflection mirror $M_1$. At this time, the merits of a reflecting optical system are lost, the construction of the refracting optical system is more complicated, and aberration correction becomes harder to attain.

With the above-mentioned construction, a catadioptric reduction projection optical system according to the present invention preferably satisfies the following condition:

$$0.05 < \beta_{G3} < 0.6 \qquad (3)$$

where $\beta_{G3}$ is the magnification of the third lens group $G_3$ of positive refractive power. This condition defines a proper magnification of the third lens group $G_3$, and allows for realization of a catadioptric reduction projection optical system having an excellent optical performance, and allows for obtaining a physically constructible catadioptric reduction projection optical system. The physically constructible optical system means an optical system in which optical members do not interfere with each other in an arrangement of optical members constituting the catadioptric reduction projection optical system.

When $\beta_{G3}$ exceeds the upper limit of the above-mentioned condition (3), a light beam propagating between the concave reflection mirrors $M_1$ and $M_2$ considerably overlaps a light beam propagating from the concave reflection mirror $M_2$ to the secondary image surface, and the arrangement of optical members constituting the catadioptric reduction protection optical system cannot be realized. When $\beta_{G3}$ is set below the lower limit of the above-mentioned condition (3), the refractive power of the third lens group $G_3$ increases, and coma and chromatic aberration are generated considerably.

In a catadioptric reduction projection optical system according to the present invention, it is preferable that at least one of the first to third lens groups $G_1$ to $G_3$ be constituted by at least two different glass materials. Then, chromatic aberration can be satisfactorily corrected, and an imaging performance can be further improved. In particular, this construction is effective when a light source having a predetermined wavelength width is used.

It is preferable that a catadioptric reduction projection optical system according to the present invention have at least two planar reflection mirrors. With this construction, the object surface and the image surface can be set to be parallel to each other.

In order to achieve the above objects, there is provided a catadioptric reduction projection optical system according to another aspect of the present invention comprising:

a first partial optical system for forming a primary image of the object; and a second partial optical system for forming a secondary image of the object based on light from the primary image, the first partial optical system having a first lens group of positive refractive power, a second lens group of negative refractive power, and a first concave reflection mirror in succession from a light incident side, and the second partial optical system having a second concave reflection mirror, and a fourth lens group of positive refractive power, wherein a third lens group of positive or negative refractive power is disposed in a light path between the first concave reflection mirror and the second concave reflection mirror, the first to fourth lens groups consist of at least one material selected from the group consisting of quartz glass and fluorite, and a magnification factor $\beta_{M1}$ of the first concave reflection mirror and a magnification factor $\beta_{M2}$ of the second concave reflection mirror meet conditions of:

$$-1.0 < \beta_{M1} < -0.7$$

$$-2.5 < \beta_{M2} < -1.2.$$

In order to satisfactorily correct other aberrations while correcting chromatic aberration in a wide bandwidth and providing a large numerical aperture, it is preferable that not only the refractive power of the reflection mirror but also that of a refractive member be strengthened. Therefore, it is preferable that the refractive member be constituted by two kinds of glass, i.e., fluorite and quartz glass. When the wavelength used for a light source is at a short wavelength side, and particularly is 250 nm or less, an advantage can be obtained in terms of a transmittance.

A catadioptric reduction projection optical system according to still another aspect of the present invention satisfies the following condition:

$$-1.0 < \beta_{M1} < -0.7 \qquad (4)$$

where $\beta_{M1}$ is the magnification of the first concave reflection mirror. This condition defines a proper magnification factor of the first concave reflection mirror, and allows for realization of a catadioptric reduction projection optical system having an excellent optical performance, and allows for obtaining a physically constructible catadioptric reduction projection optical system. The physically constructible optical system means an optical system in which optical members do not interfere with each other in an arrangement of optical members constituting the catadioptric reduction projection optical system.

When $\beta_{M1}$ exceeds the upper limit of the above-mentioned condition (4), the refractive power of the first concave reflection mirror increases, and aberrations, especially, spherical aberration and coma, generated by the first concave reflection mirror increase. In order to cancel these aberrations, the negative refractive power of a refracting optical system must be strengthened, and it becomes difficult to satisfactorily correct these aberrations. For this reason, the upper limit of $\beta_{M1}$ is set to −0.8. When $\beta_{M1}$ is set below the lower limit of the condition (4), the refractive power of the refracting optical system must compensate for a decrease in refractive power of the first concave reflection mirror. It is not preferable to further complicate the construction of the refracting optical system due to correction of aberrations. As for the chromatic aberration, since each lens group of a refractive system achieves achromatism, this operation complicates the refractive system more. At the same time, coma is generated due to an increase in secondary spectrum and its color, and it is difficult to correct the coma. Therefore, it is preferable that the lower limit of $\beta_{M1}$ be set to −1.0.

A catadioptric reduction projection optical system according to still another aspect of the present invention satisfies the following condition:

$$-2.5 < \beta_{M2} < -1.2 \qquad (5)$$

where $\beta_{M2}$ is the magnification of the second concave reflection mirror. This condition defines a proper magnification factor of the second concave reflection mirror, and allows for the realization of a catadioptric reduction projection optical system having an excellent optical performance, and allows for obtaining a physically constructible catadioptric reduction projection optical system.

When $\beta_{M2}$ exceeds the upper limit of the above-mentioned condition (5), the refractive power of the second concave reflection mirror increases, and aberrations, especially, spherical aberration and coma, generated by the second concave reflection mirror increase. In order to cancel these aberrations, the negative refractive power of a refracting optical system must be strengthened, and it becomes difficult to satisfactorily correct these aberrations. For this reason, the upper limit of $\beta_{M2}$ is preferably set to −1.5.

When $\beta_{M2}$ is set below the lower limit of the condition (5), the refractive power of the refracting optical system must compensate for a decrease in refractive power of the second concave reflection mirror. It is not preferable to further complicate the construction of the refracting optical system due to correction of aberrations. As for the chromatic aberration, since each lens group of a refractive system achieves achromatism, this operation complicates the refractive system more. At the same time, coma is generated due to an increase in secondary spectrum and its color, and it is difficult to correct the coma. Therefore, it is more preferable that the lower limit of $\beta_{M2}$ be set to −2.3.

A catadioptric reduction projection optical system according to still another aspect of the present invention preferably satisfies the following condition:

$$0.05 < \beta_{G4} < 0.3 \qquad (6)$$

where $\beta_{G4}$ is the magnification of the fourth lens group $G_4$ having positive refractive power. This condition defines a proper magnification factor of the fourth lens group $G_4$, and allows for realization of a catadioptric reduction projection optical system having an excellent optical performance, and allows for obtaining a physically constructible catadioptric reduction projection optical system. When $\beta_{M4}$ exceeds the upper limit of the above-mentioned condition (6), the refractive power of the fourth lens group $G_4$ decreases, and an optical system disposed in a light path before the fourth lens group $G_4$ compensates for a decrease in refractive power of the fourth lens group $G_4$. In particular, the first and second concave reflection mirrors tend to compensate for the refractive power of the fourth lens group $G_4$, and aberrations generated by the first and second concave reflection mirrors cannot be corrected. Further, light beams before and after incidence on the second concave reflection mirror or lenses at incident and exit sides tend to interfere with each other, and it becomes difficult to achieve a constructible optical arrangement. Taking this problem into consideration, it is more preferable that the upper limit of $\beta_{G4}$ be set to 0.2.

When $\beta_{G4}$ is set below the lower limit of the condition (6), the refractive power of the second concave reflection mirror increases, and aberrations, especially, spherical aberration and coma, generated by the fourth lens group $G_4$ increase. As for the chromatic aberration, since each lens group of a refractive system achieves achromatism, this operation complicates the refractive system more. At the same time, coma is generated due to an increase in secondary spectrum and its color, and it is difficult to correct the coma. Therefore, it is more preferable that the lower limit of $\beta_{G4}$ be set to 0.1. The balance of aberration of the lens groups in the catadioptric reduction projection optical system according to still another aspect of the present invention will now be discussed. The first lens group is arranged in the vicinity of the object, has a function of maintaining telecentric characteristics, and corrects distortion. The second lens group mainly corrects spherical aberration and coma generated by a concave reflection mirror and convex lens groups. The third and fourth lens groups contribute to formation of the reduced image and to correction of the Petzval sum. In particular, the third lens group functions as a so-called field lens, and allows a light beam from a position near the optical axis of the first concave reflection mirror to pass therethrough. With this construction, the light beam passes near the optical axis of the second concave reflection mirror. Thus, any aberration in the second concave reflection mirror can be prevented.

Preferred embodiments of the present invention are now explained. FIG. 1 shows light path for a first embodiment of the present invention. As shown, a light beam from an object surface passes through a first group of lenses $G_1$ comprising a biconvex positive lens $L_{11}$ and a negative meniscus lens $L_{12}$ having a convex surface thereof facing the object, is directed to a first concave reflection mirror $M_1$ where it is reflected and reduced by a factor $\beta_{M1}$, and is directed to a second group of lenses $G_2$ comprising a negative meniscus lens $L_{21}$ having a convex-surface thereof facing the first concave reflection mirror $M_1$ and a positive lens $L_{22}$ having a stronger radius of curvature on a surface facing the first concave reflection mirror $M_1$. It is further reduced by the second group of lenses $G_2$ to form a primary image $I_1$. The light beam from the primary image $I_1$ is reflected by the light path deflecting planar reflection mirror $M_3$, directed to a second concave reflection mirror $M_2$ and is reflected thereby so that it is magnified by a factor which is slightly larger than unity. It is reduced by a third group of lenses $G_3$ comprising a positive lens $L_{31}$ having a stronger radius of curvature or a surface facing the second concave reflection mirror $M_2$, a meniscus lens $L_{32}$ having a convex surface facing the second concave reflection mirror $M_2$ and a positive lens $L_{33}$ having a stronger radius of curvature on a surface facing the second concave reflection mirror $M_2$ so that a secondary image $I_2$ which is reduction of the primary image $I_1$ is formed. A negative lens having a weak negative refractive power is arranged, as a fourth group of lenses $G_4$, between the second concave reflection mirror $M_2$ and the third group of lenses $G_3$, to correct higher order spherical aberration.

In the above construction, the first group of lenses $G_1$, the first concave reflection mirror $M_1$ and the second group of lenses $G_2$ form the first partial optical system, the second concave reflection mirror $M_2$, the third group of lenses $G_3$ and the fourth group of lenses $G_4$ form the second partial optical system. The second group of lenses $G_2$ in the first partial optical system is provided on only one side of an optical axis Ax1 of the first partial optical system so that it does not interrupt the light beam directed to the first concave reflection mirror $M_1$ and condenses only the reflected light from the light concave reflection mirror $M_1$. The light path deflecting planar reflection mirror $M_3$ is obliquely arranged at an angle of 45° to the optical axis Ax1 of the first partial optical system in the vicinity of the third group of lenses $G_3$, and the optical axis Ax2 of the second partial optical system is orthogonal to the optical axis Ax1 of the first partial optical system. Since the planar reflection mirror $M_3$ is arranged in the vicinity of the primary image $I_1$, more specifically exit light side vicinity of the primary image $I_1$, the dimension thereof is small and it can be arranged by cutting off a portion of the first positive lens $L_{31}$ in the third group of lenses $G_3$. The fourth group of lenses $G_4$ in the second partial optical system is arranged not to interrupt the light path of the first partial optical system. While the angle of inclination of the planar reflection mirror $M_3$ is 45° in the present embodiment, it may be any angle so long as the separation of the light path is attained.

The first embodiment has a reduction factor of +0.25 or ¼ as a while and a numerical aperture (N.A.) of 0.4 in a ring-shaped view field centered at an arc having a radius of 25 mm from the optical axis.

Data of the first embodiment is shown in a table below, in which signs of the refractive index and the plane-to-plane distance are reversed by the reflection by the concave reflection mirror. The position of the third reflection mirror $M_3$ for deflecting the light path is omitted since it is not essential in the optical design.

TABLE 1

Data of First Embodiment

| No. | Radius of Curvature | Plane-to-Plane Distance | Refractive Index | |
|---|---|---|---|---|
|  | (Object Plane) | 47.063 | 1.000 | |
| 1 | 677.873 | 25.000 | 1.500 | $L_{11}$ $G_1$ |
| 2 | −988.280 | 22.657 | 1.000 | |
| 3 | 591.515 | 25.020 | 1.500 | $L_{12}$ |
| 4 | 288.196 | 990.000 | 1.000 | |
| 5 | −744.372 | −479.502 | −1.000 | $M_1$ |
| 6 | −131.046 | −12.701 | −1.500 | $L_{21}$ $G_2$ |
| 7 | −83.678 | −3.000 | −1.000 | |
| 8 | −88.873 | −53.909 | −1.500 | $L_{22}$ |
| 9 | 742.557 | −250.755 | −1.000 | |
| 10 | 2588.139 | −20.000 | −1.500 | $G_4$ |
| 11 | −24840.890 | −376.150 | −1.000 | |
| 12 | 681.247 | 376.150 | 1.000 | $M_2$ |
| 13 | −24840.890 | 20.000 | 1.500 | $G_4$ |
| 14 | 2588.139 | 203.875 | 1.000 | |
| 15 | 277.553 | 16.500 | 1.500 | $L_{31}$ $G_3$ |
| 16 | 621.605 | 0.0500 | 1.000 | |
| 17 | 103.075 | 61.334 | 1.500 | $L_{32}$ |
| 18 | 74.101 | 5.000 | 1.000 | |
| 19 | 81.631 | 54.747 | 1.500 | $L_{33}$ |
| 20 | 461.143 | 9.946 | 1.000 | |

$\beta_{M2} = 1.18$

TABLE 1-continued

Data of First Embodiment

| No. | Radius of Curvature | Plane-to-Plane Distance | Refractive Index |
|---|---|---|---|
| | $\beta_{M1} = -0.55$ | | |
| | $\beta_{G3} = 0.501$ | | |

Figure 2:
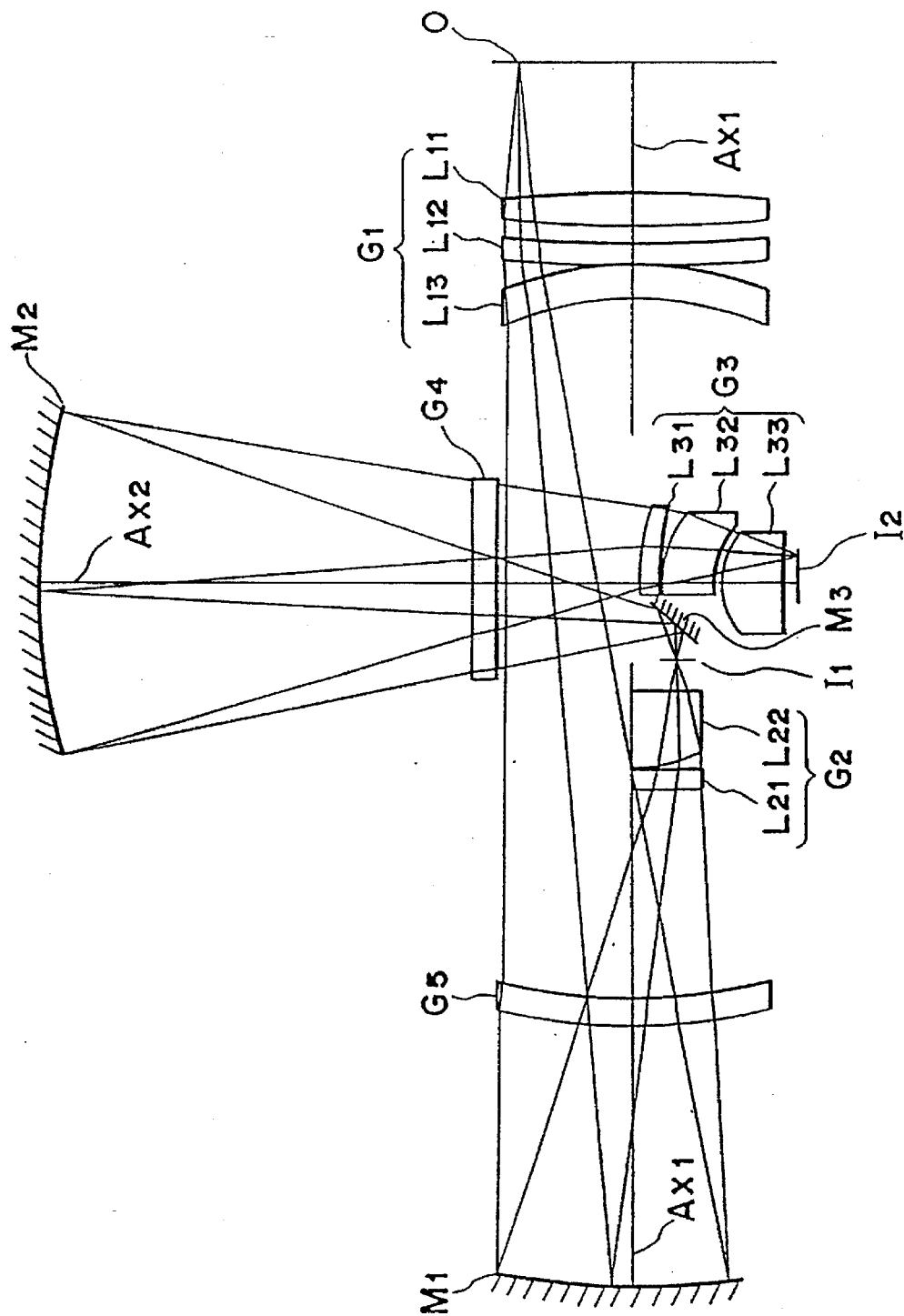
FIG. 2 shows a light path of a second embodiment of the present invention.

A second embodiment of the present invention shown in FIG. 2 is basically same as the first embodiment but the overall optical system is more compact and the first and second concave reflection mirrors $M_1$ and $M_2$ are arranged closer to the object surface O and the secondary image $I_2$ and the diameters thereof are smaller. In order to correct the aberrations generated by the compaction, a meniscus lens having a convex surface thereof facing the first concave reflection mirror $M_1$ is arranged as a fifth group of lenses $G_5$ between the first concave reflection mirror $M_1$ and the second group of lenses $G_2$ and a biconvex positive lens $L_{11}$, a meniscus lens $L_{12}$ having a concave surface thereof facing the object surface and a meniscus lens $L_{13}$ having a convex surface thereof facing the object surface are provided as the first group of lenses $G_1$.

The second embodiment has a reduction factor of +0.25 or ¼ as a whole and a numerical aperture (N.A.) of 0.4 in a ring-shaped view field centered at an arc having a radius of 25 mm from the optical axis.

Data of the second embodiment is shown in a table below.

TABLE 2

Data of Second Embodiment

| No. | Radius of Curvature | Plane-to-Plane Distance | Refractive Index | |
|---|---|---|---|---|
|  | (Object Plane) | 112.472 | 1.000 | |
| 1 | 977.575 | 30.000 | 1.500 | $L_{11}$ $G_1$ |
| 2 | −1030.934 | 15.000 | 1.000 | |
| 3 | −1446.147 | 20.000 | 1.500 | $L_{12}$ |
| 4 | −1878.184 | 0.500 | 1.000 | |
| 5 | 316.624 | 30.000 | 1.500 | $L_{13}$ |
| 6 | 289.149 | 613.035 | 1.000 | |
| 7 | −407.188 | 20.000 | 1.500 | $G_5$ |
| 8 | −469.137 | 226.192 | 1.000 | |
| 9 | −692.557 | −226.192 | −1.000 | $M_1$ |
| 10 | −469.137 | −20.000 | −1.500 | $G_5$ |
| 11 | −407.188 | −182.064 | −1.000 | |
| 12 | −6117.578 | −20.000 | −1.500 | $L_{21}$ $G_2$ |
| 13 | 3775.716 | −0.500 | −1.000 | |
| 14 | −136.376 | −71.120 | −1.500 | $L_{22}$ |
| 15 | 881.988 | −212.075 | −1.000 | |
| 16 | 2473.277 | −20.000 | −1.500 | $G_4$ |
| 17 | −44915.848 | −371.392 | −1.000 | |
| 18 | 608.000 | 371.392 | 1.000 | $M_2$ |
| 19 | −44915.848 | 20.000 | 1.500 | $G_4$ |
| 20 | 2473.277 | 125.565 | 1.000 | |
| 21 | 254.431 | 17.000 | 1.500 | $L_{31}$ $G_3$ |
| 22 | 452.400 | 0.010 | 1.000 | |
| 23 | 94.027 | 46.970 | 1.500 | $L_{32}$ |
| 24 | 69.588 | 5.000 | 1.000 | |
| 25 | 76.436 | 51.600 | 1.500 | $L_{33}$ |
| 26 | 458.225 | 11.117 | 1.000 | |

$\beta_{M2} = -1.26$
$\beta_{M1} = -0.52$
$\beta_{G3} = 0.539$

Figure 3:
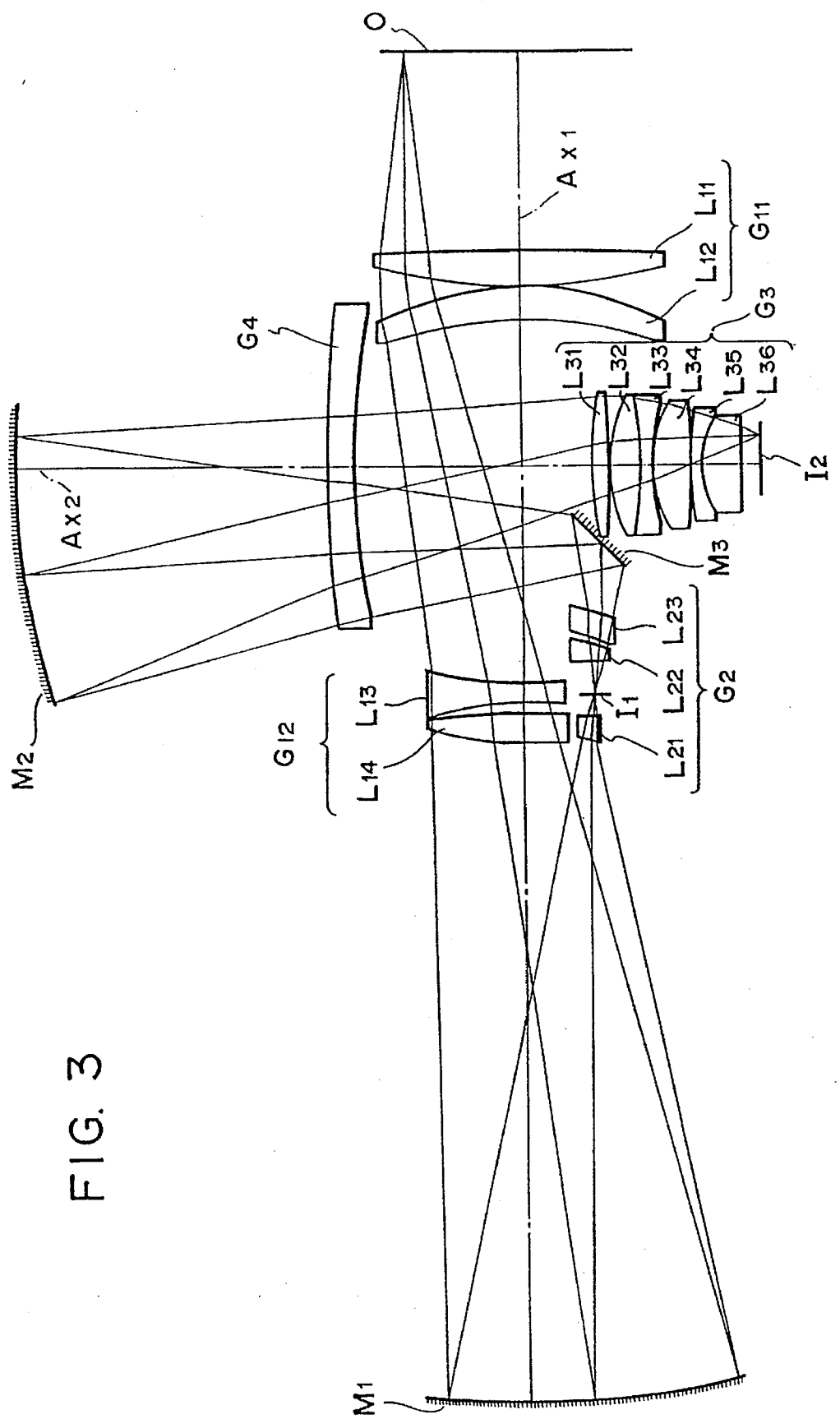
FIG. 3 shows a light path of a third embodiment of the present invention.

In a third embodiment of the present invention, as shown in FIG. 3, the first lens group $G_1$ is comprised of a front group $G_{11}$ of positive refractive power having a positive lens $L_{11}$ having its surface of sharper curvature facing the image side and a positive meniscus lens $L_{12}$ having its convex surface facing the object side, and a rear group $G_{12}$ of negative refractive power having a biconcave negative lens $L_{13}$ and a positive lens $L_{14}$ having its surface of sharper curvature facing the image side. A reduction magnification can be provided by the first lens group $G_1$ constituting such a telephoto type and therefore, it becomes unnecessary to provide a reduction magnification in the second lens group $G_2$, which is comprised of a negative lens $L_{21}$ disposed immediately forwardly of the primary reduced image $I_1$, a positive lens $L_{22}$ disposed immediately rearwardly of the primary reduced image $I_1$ and a meniscus lens $L_{23}$ having its concave surface facing the primary reduced image $I_1$ side, and it is possible to effect the correction of off-axis aberrations well. Therefore, it becomes possible to make the numerical aperture (N.A.) greater.

The functions of the first concave reflecting mirror $M_1$, the plane reflecting mirror $M_3$ for bending the optical path and the second concave reflecting mirror $M_2$ are substantially similar to those in the previously described embodiment, and the second concave reflecting mirror $M_2$ also has a magnification somewhat greater than one-to-one magnification. The third lens group $G_3$ is of a somewhat more complicated construction than the previous embodiment in order to effect good aberration correction for a greater numerical aperture. That is, a reduction magnification is given by the third lens group $G_3$ comprising two biconvex positive lenses $L_{31}$, $L_{32}$, a biconcave negative lens $L_{33}$, a positive lens $L_{34}$ having its surface of sharper curvature facing the second concave reflecting mirror $M_2$ side, a negative lens $L_{35}$ having its surface of sharper curvature facing the image side, and a positive lens $L_{36}$ having its surface of sharper curvature facing the second concave reflecting mirror $M_2$ side, and there is formed a secondary image $I_2$ more reduced than the primary image $I_1$. Again in this embodiment, a negative lens having weak negative refractive power as the fourth lens group $G_4$ is disposed between the second concave reflecting mirror $M_2$ and the third lens group $G_3$, whereby spherical aberration of high orders are corrected well.

In the construction of this third embodiment, the first lens group $G_1$, the first concave reflecting mirror $M_1$ and the negative lens $L_{21}$ in the second lens group $G_2$ can be regarded as constituting a first partial optical system, and the positive lens $L_{22}$ and the meniscus lens $L_{23}$ having its concave surface facing the primary reduced image $I_1$ side in the second lens group $G_2$, the second concave reflecting mirror $M_2$, the third lens group $G_3$ and the fourth lens group $G_4$ can be regarded as constituting a second partial optical system. On the other hand, the first lens group $G_1$ and the first concave reflecting mirror $M_1$ can be regarded as constituting the first partial optical system, the second concave reflecting mirror $M_2$, the third lens group $G_3$ and the fourth lens group $G_4$ can be regarded as constituting the second partial optical system, and relative to these, the second lens group $G_2$ for aberration correction can be regarded as being disposed near the primary reduced image $I_1$.

The rear group $G_{12}$ in the first lens group $G_1$ is provided only on one side of the optical axis Ax1 of the first partial optical system to make only the light travelling toward the first concave reflecting mirror $M_1$ diverge without intercepting the reflected light beam from the first concave reflecting mirror $M_1$. Also, the plane reflecting mirror $M_3$ for bending the optical path is obliquely disposed near the third lens group $G_3$ at an angle of 45° with respect to the optical axis Ax1 of the first partial optical system, and the optical axis Ax2 of the second partial optical system is made orthogonal to the optical axis Ax1 of the first partial optical system. This plane reflecting mirror $M_3$, as in the previously described embodiment, is near the primary image $I_1$ and therefore the size thereof is small, and this mirror can be installed in the space near the third lens group $G_3$.

Since the optical path of the second partial optical system is disposed between the front group $G_{11}$ and rear group $G_{12}$ in the first lens group $G_1$, the whole optical system can be made compact without waste of space. Also, of course, as in the previous embodiment, the fourth lens group $G_4$ in the second partial optical system is provided so as not to interrupt the optical path of the first partial optical system.

Again this third embodiment has a reduction magnification +0.25 i.e., a reduction rate of one fourth, as a whole, and secures a zonal field of view having a radius of 25 mm from the optical axis, but has a great numerical aperture (N.A.) of 0.45.

The numerical data of the third embodiment are shown in a table below. In the table, it is to be understood that the signs of the refractive indices and the inter-surface spacings are reversed by the reflection on the concave reflecting mirror, and again here, the location of the third reflecting surface $M_3$ for bending the optical path is not essential in optical design and therefore is omitted.

TABLE 3

Numerical Data of the Third Embodiment

| No. | Radius of Curvature | Inter-surface Distance | Refractive Index | |
|---|---|---|---|---|
|  | (Object surface) | 179.407 | 1.000 | |
| 1 | 3465.978 | 30.000 | 1.501 | $L_{11}$ $G_{11}$ $G_1$ |
| 2 | −528.018 | 0.100 | 1.000 | |
| 3 | 261.503 | 31.759 | 1.501 | $L_{12}$ |
| 4 | 390.000 | 316.878 | 1.000 | |
| 5 | −354.698 | 17.000 | 1.501 | $L_{13}$ $G_{12}$ |
| 6 | 255.219 | 11.599 | 1.000 | |
| 7 | 1186.851 | 25.883 | 1.501 | $L_{14}$ |
| 8 | −281.461 | 580.467 | 1.000 | |
| 9 | −766.948 | −589.210 | −1.000 | $M_1$ |
| 10 | 243.085 | −14.000 | −1.501 | $L_{21}$ $G_2$ |
| 11 | 3114.038 | −50.454 | −1.000 | |
| 12 | −3513.309 | −22.000 | −1.501 | $L_{22}$ |
| 13 | 253.255 | −8.618 | −1.000 | |
| 14 | 169.996 | −20.000 | −1.501 | $L_{23}$ |
| 15 | 230.045 | −270.073 | −1.000 | |
| 16 | 642.510 | −23.000 | −1.501 | $G_4$ |
| 17 | 1268.362 | −277.914 | −1.000 | |
| 18 | 659.079 | 277.914 | 1.000 | $M_2$ |
| 19 | 1268.362 | 23.000 | 1.501 | $G_4$ |
| 20 | 642.510 | 208.073 | 1.000 | |
| 21 | 340.589 | 16.500 | 1.501 | $L_{31}$ $G_3$ |
| 22 | −716.211 | 20.500 | 1.000 | |
| 23 | 150.058 | 26.000 | 1.501 | $L_{32}$ |
| 24 | −323.551 | 1.320 | 1.000 | |
| 25 | −261.398 | 9.000 | 1.501 | $L_{33}$ |
| 26 | 209.855 | 0.500 | 1.000 | |
| 27 | 108.115 | 34.184 | 1.501 | $L_{34}$ |
| 28 | −724.878 | 0.500 | 1.000 | |
| 29 | 469.777 | 9.000 | 1.501 | $L_{35}$ |
| 30 | 70.411 | 1.400 | 1.000 | |
| 31 | 77.096 | 34.266 | 1.501 | $L_{36}$ |
| 32 | −720.000 | 15.100 | 1.000 | |
|  | $\beta_{M2} = -1.16$ | | | |
|  | $\beta_{M1} = -0.57$ | | | |
|  | $\beta_{G3} = 0.3275$ | | | |

Figure 4:
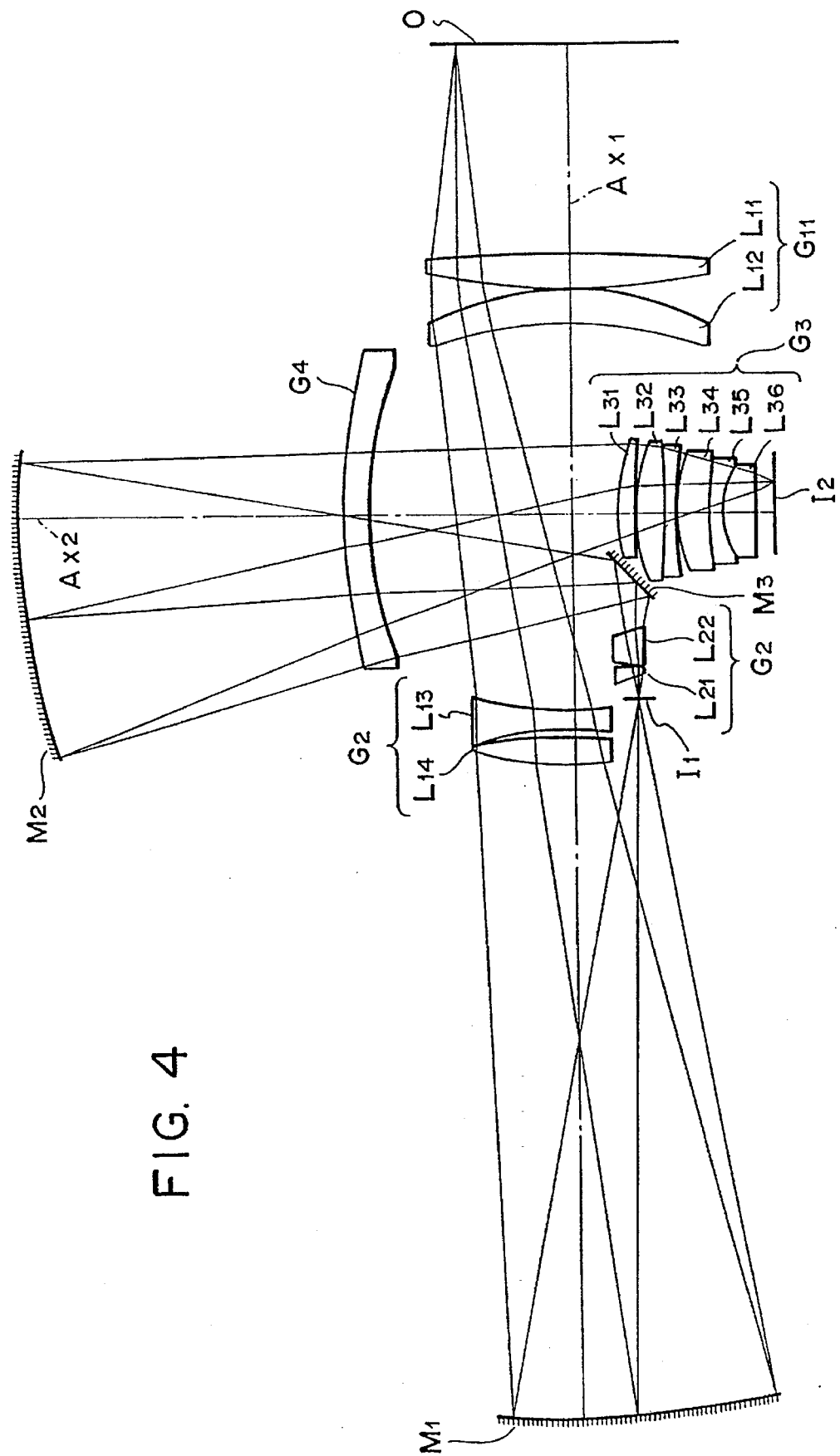
FIG. 4 shows a light path of a fourth embodiment of the present invention.

In a fourth embodiment of the present invention, as shown in FIG. 4, the construction of the first lens group $G_1$ is basically similar to that in the third embodiment, but the second lens group $G_2$ is comprised of a positive lens $L_{21}$ and a biconcave negative lens $L_{22}$ disposed immediately rearwardly of the primary reduced image $I_1$, and no lens is present immediately forwardly of the primary reduced image $I_1$, i.e., between the first concave reflecting mirror $M_1$ adjacent to the first partial optical system and the primary reduced image $I_1$. In this embodiment, a reduction magnification is provided and aberration correction is sufficiently done in the first lens group $G_1$ comprising a front group $G_{11}$ of positive refractive power and a rear group $G_{12}$ of negative refractive power and therefore, the construction of the second lens group $G_2$ can be made simple.

The constructions of the other lens groups in this embodiment are substantially similar to those in the third embodiment.

Again this fourth embodiment has a reduction magnification +0.25, i.e., a reduction rate of one fourth, as a whole, and has a great numerical aperture (N.A.) of 0.45 in a zonal field of view having a radius of 25 mm from the optical axis.

The numerical data of the fourth embodiment are shown in Table 4 below.

TABLE 4

Numerical Data of the Fourth Embodiment

| No. | Radius of Curvature | Inter-surface Distance | Refractive Index | |
|---|---|---|---|---|
|  | (Object surface) | 187.568 | 1.000 | |
| 1 | 1446.067 | 30.000 | 1.501 | $L_{11}$ $G_{11}$ $G_1$ |
| 2 | −640.000 | 0.100 | 1.000 | |
| 3 | 274.000 | 31.759 | 1.501 | $L_{12}$ |
| 4 | 390.000 | 345.240 | 1.000 | |
| 5 | −338.360 | 17.000 | 1.501 | $L_{13}$ $G_{12}$ |
| 6 | 273.442 | 7.464 | 1.000 | |
| 7 | 590.613 | 25.883 | 1.501 | $L_{14}$ |
| 8 | −281.411 | 589.287 | 1.000 | |
| 9 | −831.145 | −656.955 | −1.000 | $M_1$ |
| 10 | 180.000 | −23.000 | −1.501 | $L_{21}$ $G_2$ |
| 11 | −2908.427 | −5.005 | −1.000 | |
| 12 | −429.596 | −18.000 | −1.501 | $L_{22}$ |
| 13 | 197.384 | −292.451 | −1.000 | |
| 14 | 380.443 | −23.000 | −1.501 | $G_4$ |
| 15 | 596.210 | −294.291 | −1.000 | |
| 16 | 653.346 | 294.291 | 1.000 | $M_2$ |
| 17 | 596.210 | 23.000 | 1.501 | $G_4$ |
| 18 | 380.443 | 222.451 | 1.000 | |
| 19 | 153.779 | 17.000 | 1.501 | $L_{31}$ $G_3$ |
| 20 | 689.474 | 0.500 | 1.000 | |
| 21 | 156.334 | 26.500 | 1.501 | $L_{32}$ |
| 22 | −680.839 | 0.822 | 1.000 | |
| 23 | −508.366 | 9.000 | 1.501 | $L_{33}$ |
| 24 | 391.014 | 0.500 | 1.000 | |
| 25 | 143.155 | 29.818 | 1.501 | $L_{34}$ |
| 26 | 485.639 | 0.500 | 1.000 | |
| 27 | 267.611 | 9.000 | 1.501 | $L_{35}$ |
| 28 | 65.131 | 1.400 | 1.000 | |
| 29 | 66.963 | 28.952 | 1.501 | $L_{36}$ |
| 30 | −844.417 | 15.100 | 1.000 | |

$\beta_{M2} = -1.17$
$\beta_{M1} = -0.55$
$\beta G_3 = 0.3562$

In the above embodiments, the first concave reflection mirror $M_1$ and the second concave reflection mirrors $M_2$ are spherical although they may be non-spherical such as oval. In this case, the fourth group of lenses $G_4$ may be omitted as described above.

In the catadioptric reduction projection optical systems according to the first to fourth embodiments, the first concave reflection mirror $M_1$ has a relatively large reduction factor and plays an important role in balancing the compactness of the entire system and the correction of aberration. Thus, in the first to fourth embodiments, it is preferable to satisfy:

$-0.7 < \beta_{M1} < -0.3$ where $\beta_{M1}$ is the magnification of the first concave reflection mirror $M_1$.

Figure 5:
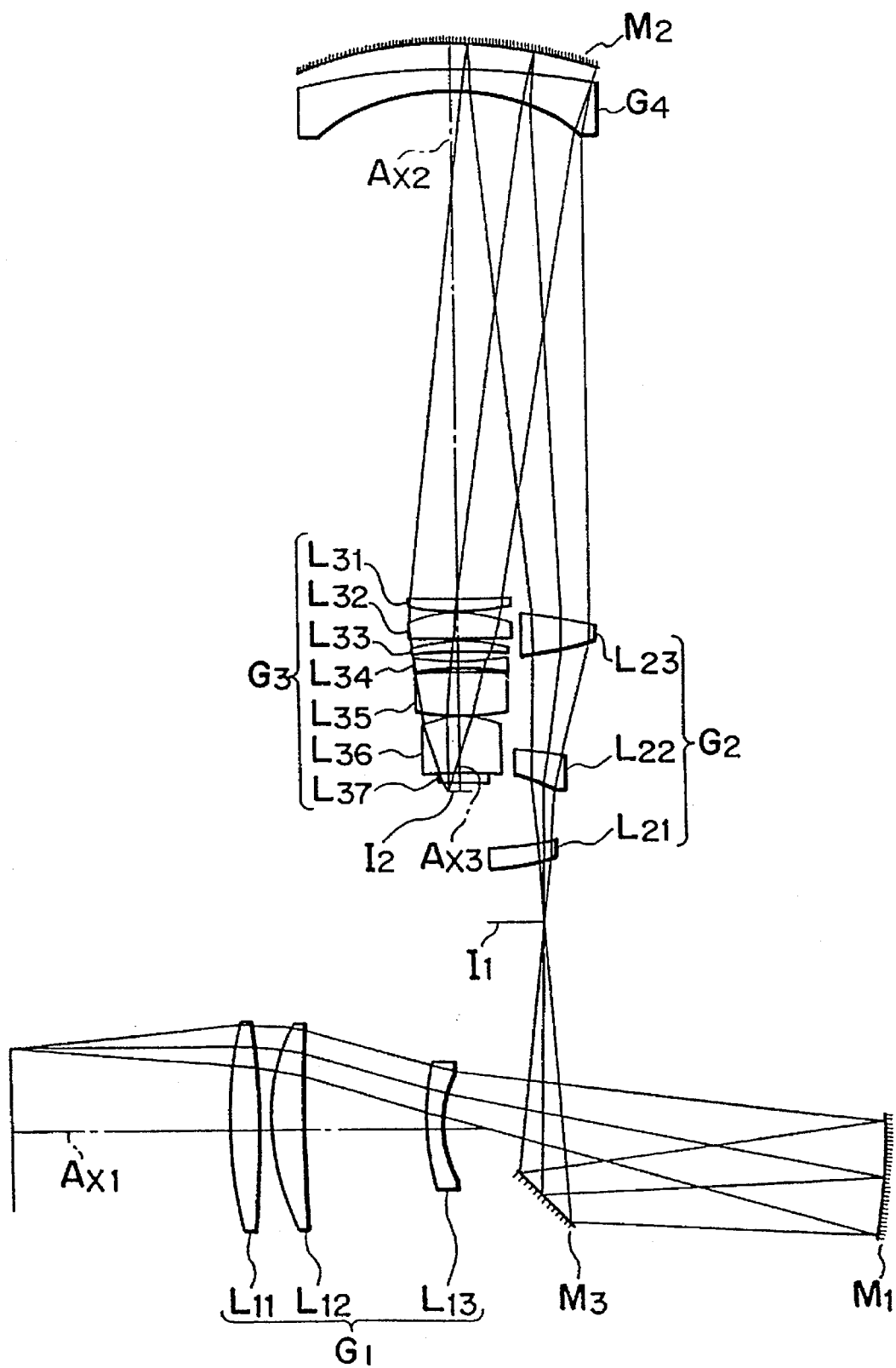
FIG. 5 shows a light path of a fifth embodiment according to the present invention.

FIG. 5 Shows a light path construction according to the fifth embodiment of the present invention. As shown in FIG. 5, a light beam from an object surface passes through a first lens group $G_1$ which comprises a biconvex positive lens $L_{11}$, a positive meniscus lens $L_{12}$ having a convex surface facing the object side, and a negative meniscus lens $L_{13}$ having a convex surface facing the object side, and has positive refractive power as a whole, and is reflected by a first concave reflection mirror $M_1$ having a magnification slightly smaller than unity. Then, the light path is bent by a planar reflection mirror $M_3$. The first lens group $G_1$ mainly functions to correct distortion and to maintain telecentric characteristics. The first lens group $G_1$ and the first concave reflection mirror $M_1$ form a primary reduced image $I_1$.

A light beam from the primary image $I_1$ passes through a second lens group $G_2$ comprising a positive meniscus lens $L_{21}$ having a convex surface facing the primary image side, a negative meniscus lens $L_{22}$ having a concave surface facing the primary image side, and a biconvex positive lens $L_{23}$, and reaches a second concave reflection mirror $M_2$ having an enlargement factor via a fourth lens group $G_4$ having negative refractive power. The second lens group $G_2$ mainly functions to correct distortion and curvature of field, and functions as a field lens. The fourth lens group $G_4$ comprises a negative meniscus lens having a convex surface facing the second concave reflection mirror $M_2$ side, and functions to correct aberrations caused by the first and second concave reflection mirrors $M_1$ and $M_2$.

The light beam reflected by the second concave reflection mirror $M_2$ passes through the fourth lens group $G_4$ again, and then becomes incident on a third lens group $G_3$ having positive refractive power. The third lens group $G_3$ comprises, in succession from the incident side of a light beam, a negative meniscus lens $L_{31}$ having a concave lens facing the incident side, a positive meniscus lens $L_{32}$ having a convex surface facing the incident side, a positive meniscus lens $L_{33}$ having a convex surface facing the incident side, a biconcave negative lens $L_{34}$, a biconvex positive lens $L_{35}$, a positive meniscus lens $L_{36}$ having a convex surface facing the incident side, and a positive meniscus lens $L_{37}$ having a convex surface facing the incident side. The third lens group $G_3$ has a positive Petzval sum to cancel the function of making the Petzval sum by the first and second concave reflection mirrors $M_1$ and $M_2$ negative. The third lens group $G_3$ forms a second image $I_2$ in a larger reduction scale than that of the primary image $I_1$.

In the above-mentioned construction, the first lens group $G_1$ and the first concave reflection mirror $M_1$ constitute a first partial optical system, and the second concave reflection mirror $M_2$ and the third lens group $G_3$ constitute a second partial optical system. The second lens group $G_2$ is disposed in the light path between the first and second concave reflection mirrors $M_1$ and $M_2$. The planar reflection mirror $M_3$ for bending the light path is obliquely disposed near the first lens group $G_1$ at an angle of 45° with respect to an optical axis $Ax_1$ of the first partial optical system, so that an optical axis $Ax_2$ of the second partial optical system extends perpendicular to the optical axis $Ax_1$ of the first partial optical system. The second lens group $G_2$ is disposed on only one side of the second partial optical system so as to focus light reflected by the first concave reflection mirror $M_1$ without shielding a light beam propagating toward the second concave reflection mirror $M_2$.

The fifth embodiment has a reduction factor of +0.20 or ⅕ as a whole, and achieves a numerical aperture of (N.A.) of 0.45 in a ring-shaped view field centered at an arc having a radius of 20 mm from the optical axis.

Data of the fifth embodiment is shown in Table 5 below.

In Table 5, the signs of the refractive index and the plane-to-plane distance are reversed by reflection by the concave reflection mirror. The refractive index of each glass material corresponds to that at the wavelength (248 nm) of KrF. Note that the position of the planar reflection mirror $M_3$ for bending the light path is omitted since it is not essential in the optical design.

TABLE 5

Data of Fifth Embodiment

| No. | Radius of Curvature | Plane-to-Plane Distance | Refractive Index | | |
|---|---|---|---|---|---|
| | (Object Surface) | 256.414 | 1.0000 | | |
| 1 | 571.882 | 35.000 | 1.50890 | (quartz) | $L_{11}$ |
| 2 | −1107.127 | 13.569 | 1.0000 | | |
| 3 | 286.383 | 38.000 | 1.50890 | (quartz) | $L_{12}$ |
| 4 | 2061.034 | 143.443 | 1.0000 | | |
| 5 | 323.826 | 20.000 | 1.50890 | (quartz) | $L_{13}$ |
| 6 | 134.427 | 535.000 | 1.0000 | | |
| 7 | −816.864 | −800.000 | −1.0000 | | $M_1$ |
| 8 | −435.732 | −25.000 | −1.50890 | (quartz) | $L_{21}$ |
| 9 | −664.126 | −96.462 | −1.0000 | | |
| 10 | 231.231 | −25.000 | −1.50890 | (quartz) | $L_{22}$ |
| 11 | 750.143 | −107.120 | −1.0000 | | |
| 12 | −622.742 | −59.000 | −1.50890 | (quartz) | $L_{23}$ |
| 13 | 723.951 | −616.105 | −1.0000 | | |
| 14 | 259.861 | −25.000 | −1.50890 | (quartz) | $G_4$ |
| 15 | 891.669 | −28.536 | −1.0000 | | |
| 16 | 537.817 | 28.536 | 1.0000 | | $M_2$ |
| 17 | 891.669 | 25.000 | 1.50890 | (quartz) | $G_4$ |
| 18 | 259.861 | 602.523 | 1.0000 | | |
| 19 | −1642.894 | 12.745 | 1.50890 | (quartz) | $L_{31}$ |
| 20 | −356.710 | 2.000 | 1.0000 | | |
| 21 | 166.981 | 32.465 | 1.50890 | (quartz) | $L_{32}$ |
| 22 | −4368.603 | 0.201 | 1.0000 | | |
| 23 | 188.353 | 14.825 | 1.50890 | (quartz) | $L_{33}$ |
| 24 | 489.910 | 10.157 | 1.0000 | | |
| 25 | −401.443 | 10.220 | 1.50890 | (quartz) | $L_{34}$ |
| 26 | 370.153 | 3.669 | 1.0000 | | |
| 27 | 1112.370 | 53.780 | 1.50890 | (quartz) | $L_{35}$ |
| 28 | −387.055 | 0.100 | 1.0000 | | |
| 29 | 106.932 | 70.805 | 1.50890 | (quartz) | $L_{36}$ |
| 30 | 329.200 | 0.100 | 1.0000 | | |
| 31 | 153.221 | 12.340 | 1.50890 | (quartz) | $L_{37}$ |
| 32 | 983.363 | 10.000 | 1.0000 | | |
| 33 | (Image Surface) | | | | |

<Condition Corresponding Values>

$\beta_{M2} = -1.225$
$\beta_{M1} = -0.8606$
$\beta_{G3} = 0.0761$

Figure 6:
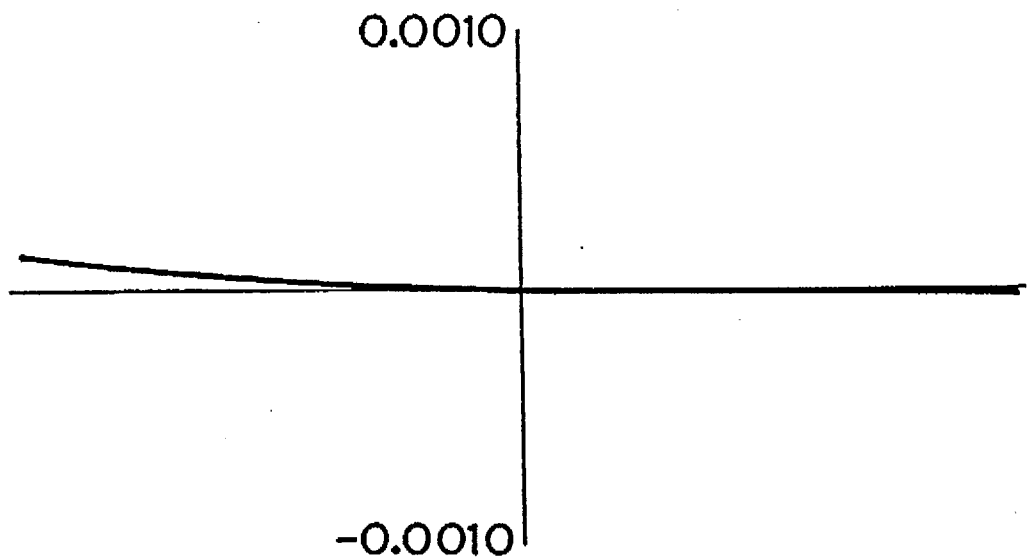
FIG. 6 is a graph showing the coma aberration of the fifth embodiment according to the present invention.

FIG. 6 shows coma for explaining the imaging performance of the fifth embodiment. FIG. 6 shows coma in the meridional direction at the center of the ring-shaped view field. As can be seen from FIG. 6, this embodiment maintains an excellent imaging performance.

Figure 7:
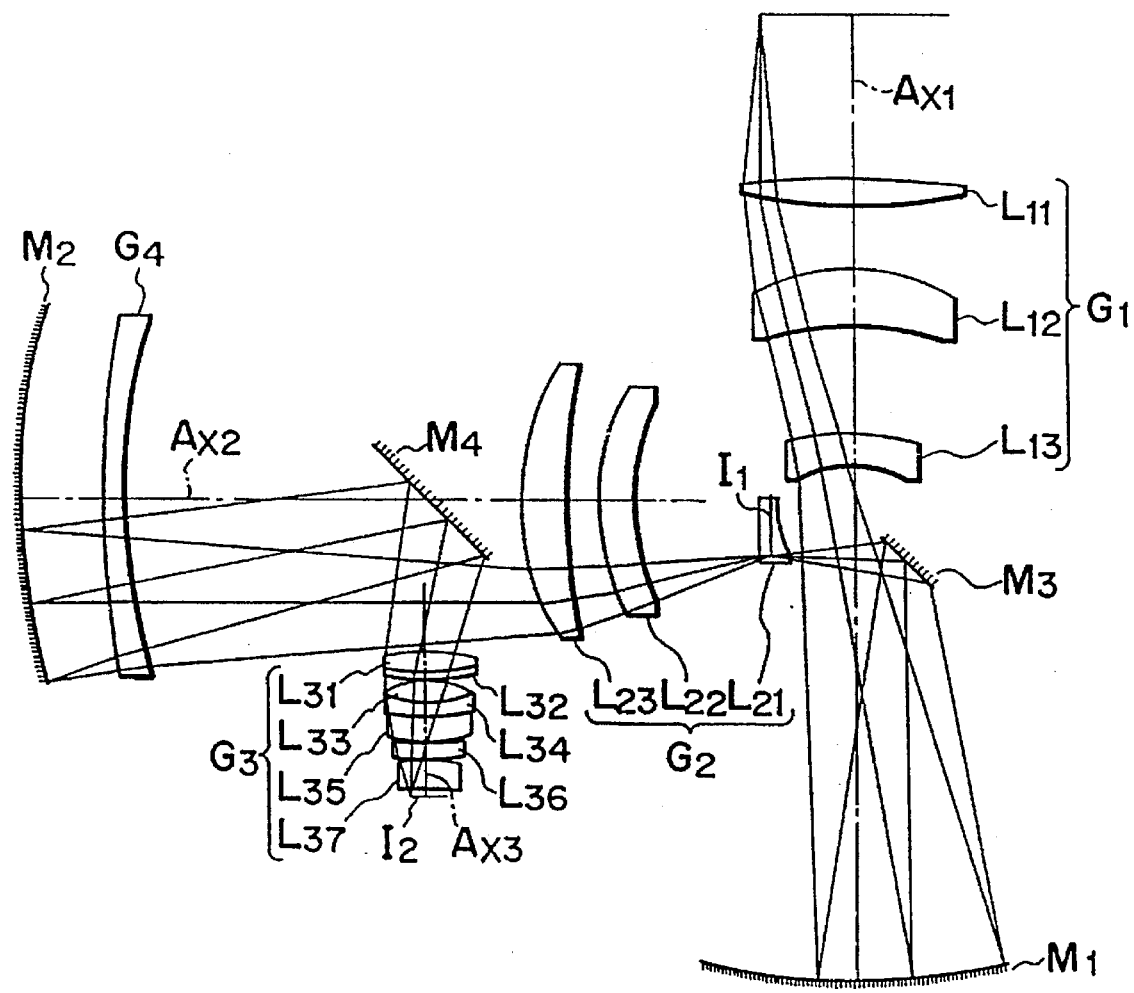
FIG. 7 shows a light path of a sixth embodiment according to the present invention.

As shown in FIG. 7, in a sixth embodiment according to the present invention, a light beam from the object surface passes through a first lens group $G_1$ which comprises a biconvex positive lens $L_{11}$, a positive meniscus lens $L_{12}$ having a convex surface facing the incident side of the light beam, and a negative meniscus lens $L_{13}$ having a convex surface facing the incident side, and has positive refractive power as a whole, and is then reflected by a first concave reflection mirror $M_1$ having a magnification slightly smaller than unity. The reflected light beam is deflected by a planar reflection mirror $M_3$ which is obliquely disposed at 45° with respect to an optical axis $Ax_1$ of the first lens group $G_1$, and then becomes incident on a second lens group $G_2$ of negative refractive power. The second lens group $G_2$ comprises, in succession from the incident side of a light beam, a negative lens $L_{21}$ having a substantially plano-concave shape, a negative meniscus lens $L_{22}$ having a concave surface facing the incident side, and a positive meniscus lens $L_{23}$ having a concave surface facing the incident side, and forms a primary image $I_1$ as a reduced image of an object in the negative lens $L_{21}$.

The light beam emerging from the second lens group $G_2$ is reflected by a second concave reflection mirror $M_2$ having a magnification larger than unity via a fourth lens group $G_4$ of negative refractive power. The fourth lens group $G_4$ comprises a negative meniscus lens having a convex surface facing the second concave reflection mirror $M_2$. The light beam reflected by the second concave reflection mirror $M_2$ is deflected by a planar reflection mirror $M_4$, which is obliquely arranged at 45° with respect to an optical axis $Ax_2$ of the second lens group $G_2$, via the fourth lens group $G_4$ again, and becomes incident on a third lens group $G_3$ of positive refractive power. The third lens group $G_3$ comprises, in succession from the incident side of a light beam, a biconvex positive lens $L_{31}$, a negative meniscus lens $L_{32}$ having a concave surface facing the incident side, a biconvex positive lens $L_{33}$, a negative meniscus lens $L_{34}$ having a concave surface facing the incident side, a positive meniscus lens $L_{35}$ having a concave surface facing the incident side, a negative meniscus lens $L_{36}$ having a concave surface facing the incident side, and a positive meniscus lens $L_{37}$ having a convex surface facing the incident side, and forms a secondary image $I_2$ in a larger reduction scale than that of the primary image $I_1$. The negative lens $L_{21}$ in the second lens group $G_2$ is arranged at only one side so as not to shield a light beam passing through the first lens group $G_1$.

The sixth embodiment, as well, has a reduction factor of +0.20 or ⅕ as a whole, and achieves a numerical aperture of (N.A.) of 0.45 in a ring-shaped view field centered at an arc having a radius of 20 mm from the optical axis.

Table 6 below shows data of the sixth embodiment.

In Table 6, the refractive index of each glass material corresponds to that at the wavelength (193 nm) of ArF.

TABLE 6

Data of Sixth Embodiment

| No. | Radius of Curvature | Plane-to-Plane Distance | Refractive Index | | |
|---|---|---|---|---|---|
| | (Object Surface) | 169.405 | 1.0000 | | |
| 1 | 901.701 | 30.575 | 1.560194 | (quartz) | $L_{11}$ |
| 2 | −510.578 | 65.853 | 1.0000 | | |
| 3 | 220.954 | 60.000 | 1.560194 | (quartz) | $L_{12}$ |
| 4 | 318.898 | 110.000 | 1.0000 | | |
| 5 | 295.985 | 33.350 | 1.560194 | (quartz) | $L_{13}$ |
| 6 | 109.856 | 544.112 | 1.0000 | | |
| 7 | −644.876 | −578.247 | −1.0000 | | $M_1$ |
| 8 | 125.313 | −20.000 | −1.560194 | (quartz) | $L_{21}$ |
| 9 | −19308.942 | −133.068 | −1.0000 | | |
| 10 | 285.898 | −40.367 | −1.560194 | (quartz) | $L_{22}$ |
| 11 | 239.639 | −32.560 | −1.0000 | | |
| 12 | 838.750 | −48.824 | −1.560194 | (quartz) | $L_{23}$ |
| 13 | 270.000 | −413.387 | −1.0000 | | |
| 14 | 690.339 | −20.000 | −1.560194 | (quartz) | $G_4$ |
| 15 | 1371.252 | −85.603 | −1.0000 | | |
| 16 | 769.864 | 85.603 | 1.0000 | | $M_2$ |

TABLE 6-continued

Data of Sixth Embodiment

| No. | Radius of Curvature | Plane-to-Plane Distance | Refractive Index | | |
|---|---|---|---|---|---|
| 17 | 1371.252 | 20.000 | 1.560194 | (quartz) | $G_4$ |
| 18 | 690.339 | 478.013 | 1.0000 | | |
| 19 | 193.080 | 19.107 | 1.501375 | (fluorite) | $L_{31}$ |
| 20 | −330.493 | 3.128 | 1.0000 | | |
| 21 | 237.620 | 4.8000 | 1.560194 | (quartz) | $L_{32}$ |
| 22 | −404.696 | 0.100 | 1.0000 | | |
| 23 | 84.943 | 25.587 | 1.501375 | (fluorite) | $L_{33}$ |
| 24 | −168.592 | 0.362 | 1.0000 | | |
| 25 | −164.717 | 13.099 | 1.560194 | (quartz) | $L_{34}$ |
| 26 | −296.532 | 2.263 | 1.0000 | | |
| 27 | −201.221 | 24.203 | 1.501375 | (fluorite) | $L_{35}$ |
| 28 | −184.897 | 0.552 | 1.0000 | | |
| 29 | −353.513 | 16.515 | 1.560194 | (quartz) | $L_{36}$ |
| 30 | −514.935 | 0.691 | 1.0000 | | |
| 31 | 170.098 | 29.846 | 1.560194 | (quartz) | $L_{37}$ |
| 32 | 642.145 | 6.065 | 1.0000 | | |
| 33 | (Image Surface) | | | | |

<Condition Corresponding Values>

$\beta_{M2} = -0.974$
$\beta_{M1} = -0.762$
$\beta_{G3} = 0.2013$

Figure 8:
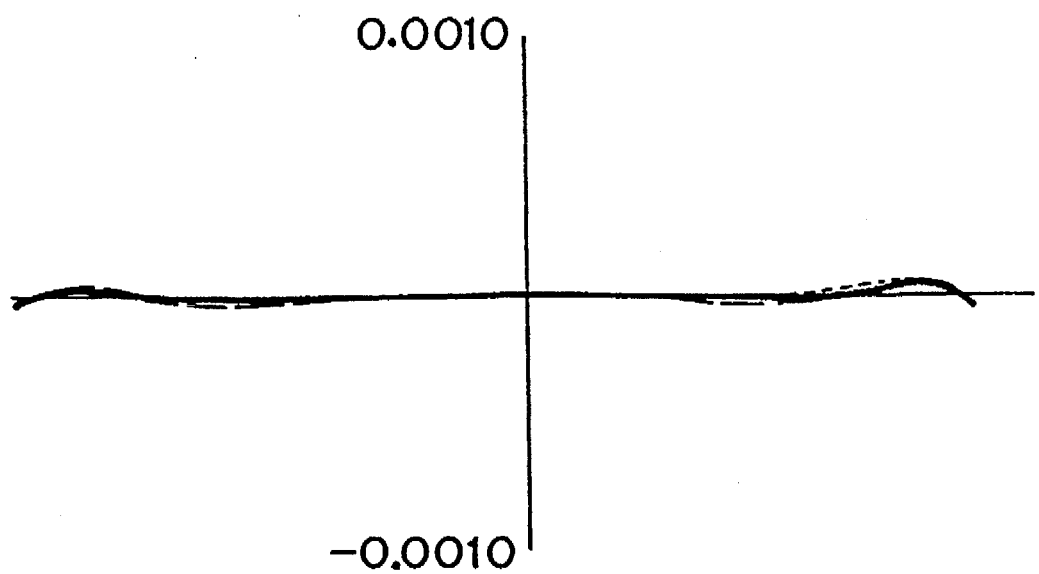
FIG. 8 is a graph showing the coma aberration of the sixth embodiment according to the present invention.

FIG. 8 shows coma for explaining the imaging performance of the sixth embodiment. FIG. 8 shows coma in the meridional direction at the center of the ring-shaped view field. Note that a solid curve in FIG. 8 represents coma at 193.3 nm, a broken curve represents coma at 193.3 nm represents coma at 192.9 nm, and a dotted curve represents coma at 193.7 nm. As can be seen from FIG. 8, the sixth embodiment can achieve correction of chromatic aberration within a range of ±0.4 nm at the wavelength of ArF, and maintains an excellent imaging performance.

Figure 9:
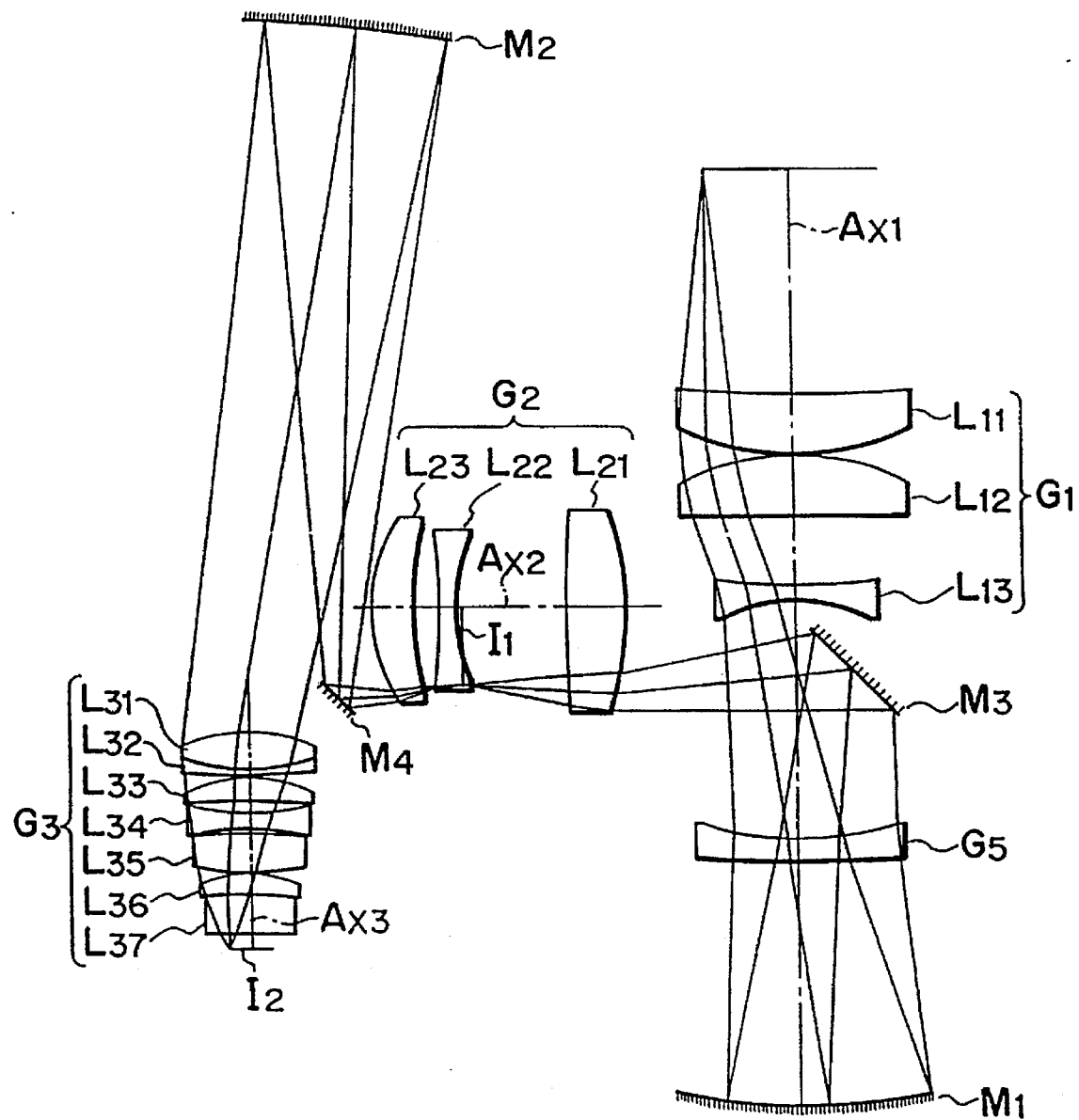
FIG. 9 shows a light path of a seventh embodiment according to the present invention.

A seventh embodiment of the present invention will be described below with reference to FIG. 9. Referring to FIG. 9, a light beam from the object surface passes through a first lens group $G_1$ which comprises a positive meniscus lens $L_{11}$ having a concave surface facing the incident side of a light beam, a biconvex positive lens $L_{12}$, and a biconcave negative lens $L_{13}$, and has positive refractive power as a whole, and becomes incident on a first concave reflection mirror $M_1$, which has a magnification slightly smaller than unity, via a fifth lens group $G_5$. The fifth lens group $G_5$ comprises a negative meniscus lens having a convex surface facing the first concave reflection mirror $M_1$, and functions to correct aberration generated by the first concave reflection mirror $M_1$ and second concave reflection mirror $M_2$. The light beam reflected by the first concave reflection mirror $M_1$ is deflected by a planar reflection mirror $M_3$ via the fifth lens group $G_5$ again, and becomes incident on a second lens group $G_2$ of positive refractive power.

The planar reflection mirror $M_3$ is obliquely arranged at 45° with respect to an optical axis $Ax_1$ of the first lens group $G_1$ in the light path between the fifth and first lens group $G_5$ and $G_1$. The second lens group $G_2$ comprises a biconvex positive lens $L_{21}$, a biconcave negative lens $L_{22}$, and a positive meniscus lens $L_{23}$ having a concave surface facing the incident side of a light beam. The light beam incident on the second lens group $G_2$ forms a primary image $I_1$ as a reduced image of an object in the negative lens $L_{22}$. The light beam emerging from the second lens group $G_2$ is deflected by a fourth planar reflection mirror $M_4$ which is obliquely arranged at 45° with respect to an optical axis $Ax_2$ of the second lens group $G_2$, is reflected by the second concave reflection mirror $M_2$ having a magnification larger than unity, and then becomes incident on a third lens group $G_3$ of positive refractive power. The third lens group $G_3$ comprises a biconvex positive lens $L_{31}$, a negative meniscus lens $L_{32}$ having a convex surface facing the incident side, a positive meniscus lens $L_{33}$ having a convex surface facing the incident side, a biconcave negative lens $L_{34}$, a biconvex positive lens $L_{35}$, a positive meniscus lens $L_{36}$ having a convex surface facing the incident side, and a positive meniscus lens $L_{37}$ having a convex surface facing the incident side. The third lens group $G_3$ forms a secondary image $I_2$ in a larger reduction scale than that of the primary image $I_1$ at the exit side thereof.

The seventh embodiment has a reduction factor of +0.25 or ¼ as a whole, and achieves a numerical aperture of (N.A.) of 0.45 in a ring-shaped view field centered at an arc having a radius of 20 mm from the optical axis.

Table 7 below shows data of the seventh embodiment.

In Table 7, the refractive index of each glass material corresponds to that at the wavelength (248 nm) of KrF.

TABLE 7

Data of Seventh Embodiment

| No. | Radius of Curvature | Plane-to-Plane Distance | Refractive Index | | |
|---|---|---|---|---|---|
| | (Object Surface) | 196.209 | 1.0000 | | |
| 1 | −1726.924 | 54.622 | 1.508385 | (quartz) | $L_{11}$ |
| 2 | 260.643 | 0.100 | 1.0000 | | |
| 3 | 214.288 | 55.000 | 1.508385 | (quartz) | $L_{12}$ |
| 4 | −3184.516 | 61.226 | 1.0000 | | |
| 5 | −634.272 | 15.000 | 1.508385 | (quartz) | $L_{13}$ |
| 6 | 142.779 | 209.364 | 1.0000 | | |
| 7 | −324.815 | 20.000 | 1.508385 | (quartz) | $G_5$ |
| 8 | −1599.830 | 223.380 | 1.0000 | | |
| 9 | −537.154 | −223.380 | −1.0000 | | $M_1$ |
| 10 | −1599.830 | −20.000 | −1.508385 | (quartz) | $G_5$ |
| 11 | −324.815 | −355.860 | −1.0000 | | |
| 12 | −286.947 | −55.000 | −1.508385 | (quartz) | $L_{21}$ |
| 13 | 1629.963 | −101.890 | −1.0000 | | |
| 14 | 165.609 | −15.000 | −1.508385 | (quartz) | $L_{22}$ |
| 15 | −750.059 | −20.606 | −1.0000 | | |
| 16 | 343.901 | −39.768 | −1.508385 | (quartz) | $L_{23}$ |
| 17 | 154.033 | −630.899 | −1.0000 | | |
| 18 | 962.895 | 630.899 | 1.0000 | | $M_2$ |
| 19 | 149.915 | 32.150 | 1.467877 | (fluorite) | $L_{31}$ |
| 20 | −187.485 | 0.100 | 1.0000 | | |
| 21 | −186.839 | 7.000 | 1.508385 | (quartz) | $L_{32}$ |
| 22 | −727.375 | 0.100 | 1.0000 | | |
| 23 | 117.358 | 20.864 | 1.508385 | (quartz) | $L_{33}$ |
| 24 | 647.785 | 8.591 | 1.0000 | | |
| 25 | −284.413 | 15.450 | 1.508385 | (quartz) | $L_{34}$ |
| 26 | 193.285 | 4.300 | 1.0000 | | |
| 27 | 388.801 | 36.187 | 1.467877 | (fluorite) | $L_{35}$ |
| 28 | −216.450 | 0.100 | 1.0000 | | |
| 29 | 113.246 | 19.238 | 1.467877 | (fluorite) | $L_{36}$ |
| 30 | 459.066 | 0.100 | 1.0000 | | |
| 31 | 221.661 | 33.854 | 1.508385 | (quartz) | $L_{37}$ |
| 32 | 1502.269 | 15.400 | 1.0000 | | |
| 33 | (Image Surface) | | | | |

<Condition Corresponding Values>

$\beta_{M2} = -2.008$
$\beta_{M1} = -1.058$
$\beta_{G3} = 0.1342$

Figure 10:
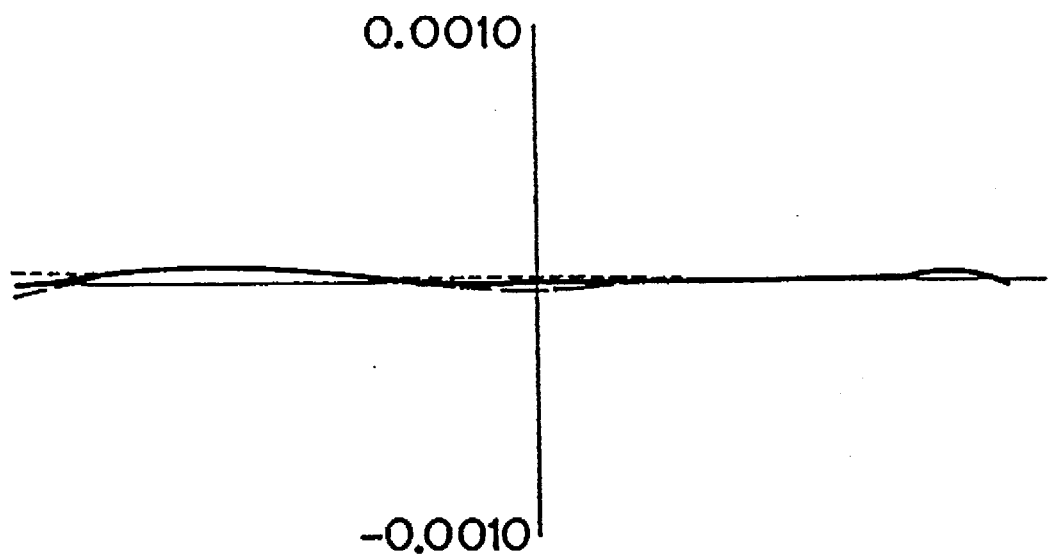
FIG. 10 is a graph showing the coma aberration of the seventh embodiment according to the present invention.

FIG. 10 shows coma for explaining the imaging performance of the seventh embodiment. FIG. 10 shows coma in the meridional direction at the center of the ring-shaped view field. Note that a solid curve in FIG. 10 represents coma at 248.4 nm, an alternate long and short dashed curve represents coma at 252.4 nm, and an alternate long and two short dashed curve represents coma at 244.4 nm. As can be seen from FIG. 10, the seventh embodiment can achieve correction of chromatic aberration within a range of ±4 nm at the wavelength of KrF, and maintains an excellent imaging performance.

Figure 11:
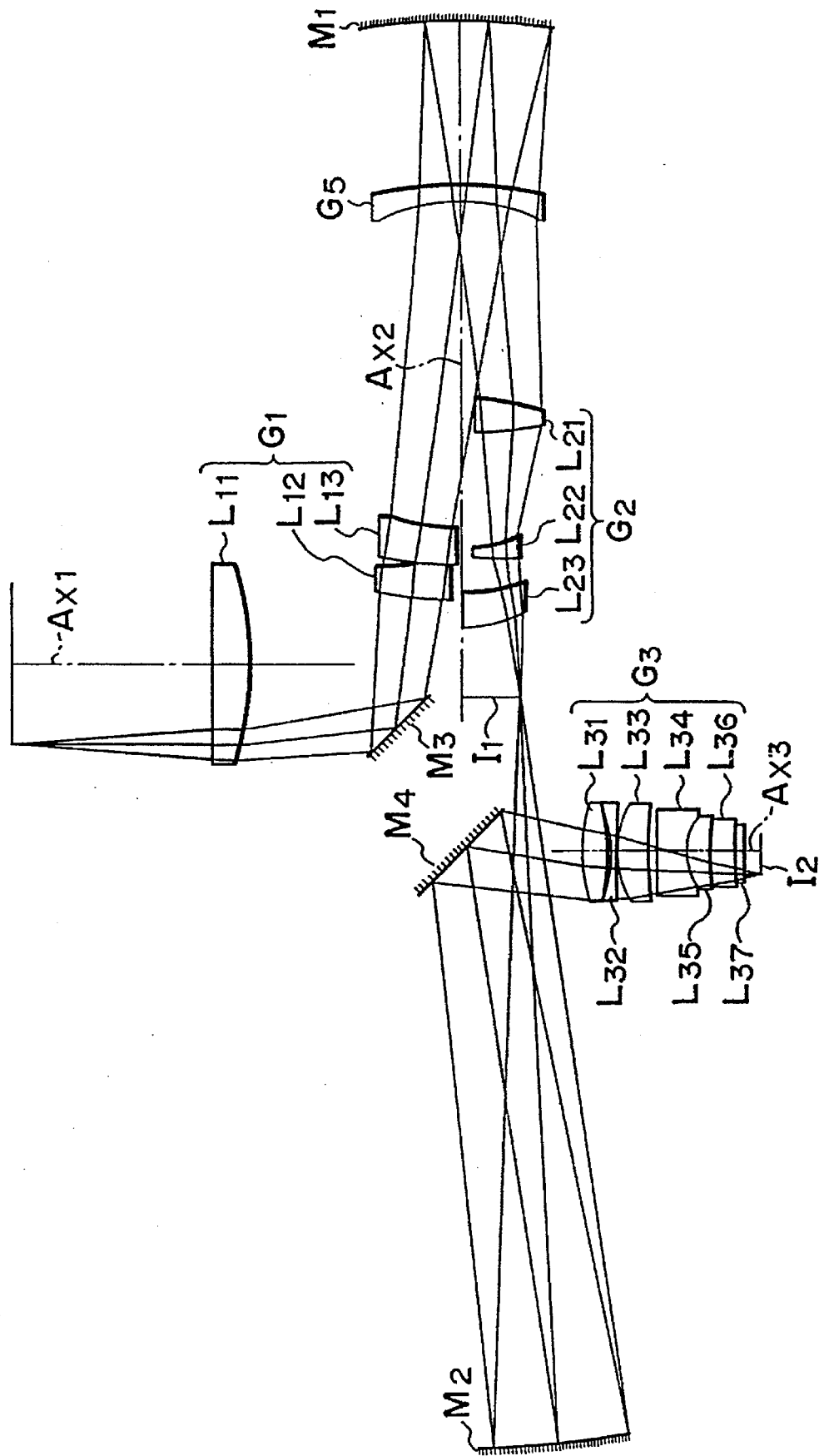
FIG. 11 shows a light path of an eighth embodiment according to the present invention.

An eighth embodiment of the present invention will be described below with reference to FIG. 11. In the eighth embodiment, as shown in FIG. 11, a light beam from the object surface is incident on a first lens group $G_1$ of positive refractive power. In the first lens group $G_1$, the light beam passes through a positive meniscus lens $L_{11}$ having a concave surface facing the incident side of a light beam, and is then deflected by a planar reflection mirror $M_3$ which is obliquely arranged at 45° with respect to an optical axis $Ax_1$ of the first lens group $G_1$. The deflected light beam passes through a biconvex positive lens $L_{12}$ and a negative meniscus lens $L_{13}$ having a convex surface facing the incident side of a light beam, and then reaches a first concave reflection mirror $M_1$ having a magnification slightly smaller than unity via a fifth lens group $G_5$ of negative refractive power. The fifth lens group $G_5$ comprises a negative meniscus lens having a convex surface facing the first concave reflection mirror side. The light beam reflected by the first concave reflection mirror $M_1$ forms a primary image $I_1$ as a reduced image of an object via the fifth lens group $G_5$ again and a second lens group $G_2$ of positive refractive power.

The second lens group $G_2$ comprises, in succession from the incident side of a light beam, a biconvex positive lens $L_{21}$, a negative meniscus lens $L_{22}$ having a concave surface facing the incident side, and a positive meniscus lens $L_{23}$ having a concave surface facing the incident side. The light beam from the primary image $I_1$ is reflected by a second concave reflection mirror $M_2$ having a magnification larger than unity. The light path of the reflected light beam is deflected by a planar reflection mirror $M_4$, and the light beam then reaches a third lens group $G_3$ of positive refractive power. The planar reflection mirror $M_4$ is obliquely arranged at 45° with respect to an optical axis $Ax_3$ of the third lens group $G_3$. The third lens group $G_3$ comprises, in succession from the incident side of a light beam, a biconvex positive lens $L_{31}$, a negative meniscus lens $L_{32}$ having a concave surface facing the incident side, a positive meniscus lens $L_{33}$ having a convex lens facing the incident side, a biconcave negative lens $L_{34}$, a positive meniscus lens $L_{35}$ having a convex surface facing the incident side, a positive meniscus lens $L_{36}$ having a convex surface facing the incident side, and a positive meniscus lens $L_{37}$ having a convex surface facing the incident side, and forms a secondary image $I_2$ in a larger reduction scale than that of the primary image $I_1$ at its exit side. The positive lens $L_{12}$ and the negative lens $L_{13}$ of the first lens group $G_1$ are arranged at only one side so as to allow a light beam toward the first concave reflection mirror to pass therethrough without shielding a light beam in the second lens group $G_2$. The second lens group $G_2$ is arranged at only one side so as to guide a light beam from the first concave reflection mirror $M_1$ without shielding a light beam in the first lens group $G_1$.

The eighth embodiment has a reduction factor of +0.25 or ¼ as a whole, and achieves a numerical aperture of (N.A.) of 0.30 in a ring-shaped view field centered at an arc having a radius of 20 mm from the optical axis.

Table 8 below shows data of the eighth embodiment.

In Table 8, the refractive index of each glass material corresponds to that at the wavelength (248 nm) of KrF.

TABLE 8

Data of Eighth Embodiment

| No. | Radius of Curvature | Plane-to-Plane Distance | Refractive Index | | |
|---|---|---|---|---|---|
| | (Object Surface) | 196.018 | 1.0000 | | |
| 1 | −5157.341 | 35.000 | 1.508385 | (quartz) | $L_{11}$ |
| 2 | −342.424 | 264.350 | 1.0000 | | |
| 3 | 418.888 | 35.000 | 1.508385 | (quartz) | $L_{12}$ |
| 4 | −2971.961 | 0.100 | 1.0000 | | |
| 5 | 479.951 | 35.000 | 1.508385 | (quartz) | $L_{13}$ |
| 6 | 219.080 | 314.800 | 1.0000 | | |
| 7 | −194.621 | 18.000 | 1.508385 | (quartz) | $G_5$ |
| 8 | −370.491 | 159.400 | 1.0000 | | |
| 9 | −586.251 | −159.400 | −1.0000 | | $M_1$ |
| 10 | −370.491 | −18.000 | −1.508385 | (quartz) | $G_5$ |
| 11 | −194.621 | −187.600 | −1.0000 | | |
| 12 | −275.679 | 35.500 | −1.508385 | (quartz) | $L_{21}$ |
| 13 | 507.601 | −112.350 | −1.0000 | | |
| 14 | 144.909 | −6.500 | −1.508385 | (quartz) | $L_{22}$ |
| 15 | −700.764 | −35.700 | −1.0000 | | |
| 16 | 198.506 | −35.000 | −1.508385 | (quartz) | $L_{23}$ |
| 17 | 137.057 | −793.600 | −1.0000 | | |
| 18 | 934.699 | 697.100 | 1.0000 | | $M_2$ |
| 19 | 167.048 | 23.800 | 1.467877 | (fluorite) | $L_{31}$ |
| 20 | −305.250 | 3.250 | 1.0000 | | |
| 21 | −269.515 | 6.500 | 1.508385 | (quartz) | $L_{32}$ |
| 22 | 1602.279 | 0.100 | 1.0000 | | |
| 23 | 83.085 | 35.000 | 1.467871 | (fluorite) | $L_{33}$ |
| 24 | 534.963 | 8.000 | 1.0000 | | |
| 25 | −2442.622 | 28.500 | 1.508385 | (quartz) | $L_{34}$ |
| 26 | 51.803 | 1.350 | 1.0000 | | |
| 27 | 52.498 | 23.600 | 1.467877 | (fluorite) | $L_{35}$ |
| 28 | 895.515 | 0.100 | 1.0000 | | |
| 29 | 159.859 | 23.400 | 1.467877 | (fluorite) | $L_{36}$ |
| 30 | 1657.174 | 0.100 | 1.0000 | | |
| 31 | 216.018 | 7.500 | 1.508385 | (quartz) | $L_{37}$ |
| 32 | 434.319 | 15.000 | 1.0000 | | |
| 33 | (Image Surface) | | | | |

<Condition Corresponding Values>

$\beta_{M2} = -1.684$
$\beta_{M1} = -0.8795$
$\beta_{G3} = 0.2035$

Figure 12:
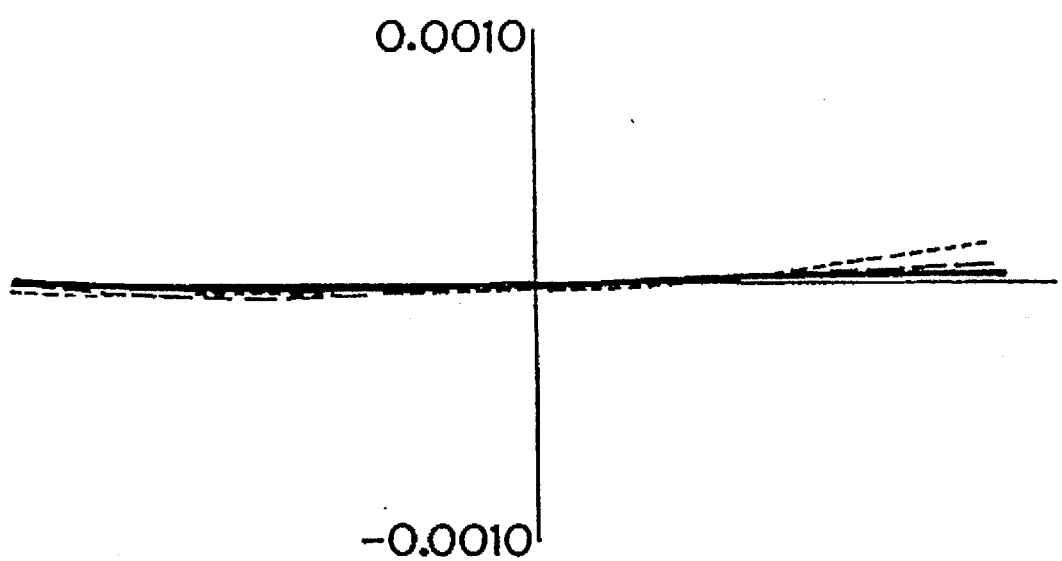
FIG. 12 is a graph showing the coma aberration of the eighth embodiment according to the present invention.

FIG. 12 shows coma for explaining the imaging performance of the eighth embodiment. FIG. 12 shows coma in the meridional direction at the center of the ring-shaped view field. Note that a solid curve in FIG. 12 represents coma at 248.4 nm, a broken curve represents coma at 238.4 nm, and a dotted curve represents coma at 258.4 nm. As can be seen from FIG. 12, the eighth embodiment can achieve correction of chromatic aberration within a range of ±10 nm at the wavelength of KrF, and maintains an excellent imaging performance.

Figure 13:
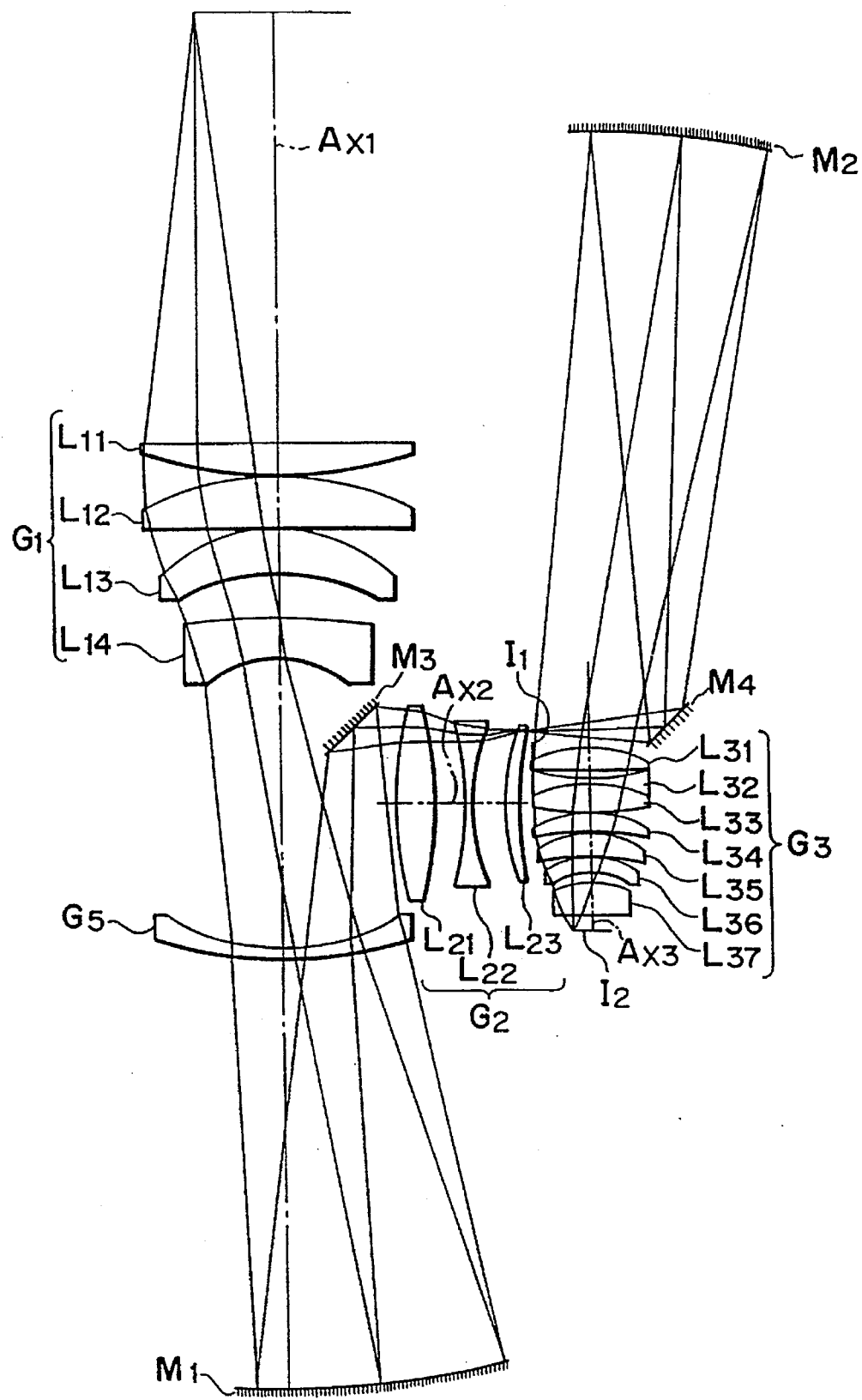
FIG. 13 shows a light path of a ninth embodiment according to the present invention.

A ninth embodiment of the present invention will be described below with reference to FIG. 13. In the ninth embodiment shown in FIG. 13, a second concave reflection mirror $M_2$ comprises a reflection mirror having a non-spherical surface. Referring to FIG. 13, a light beam from the object surface reaches a first concave reflection mirror $M_1$ having a magnification slightly smaller than unity via a first lens group $G_1$ which comprises a positive meniscus lens $L_{11}$ having a concave surface facing the incident side of a light beam, a positive meniscus lens $L_{12}$ having a convex surface facing the incident side, a positive meniscus lens $L_{13}$ having a convex surface facing the incident side, and a positive meniscus lens $L_{14}$ having a convex surface facing the incident side, and has positive refractive power as a whole, and a fifth lens group $G_5$ of negative refractive power. The fifth lens group $G_5$ comprises a negative meniscus lens having a convex surface facing the first concave reflection mirror side. The light beam reflected by the first concave reflection mirror $M_1$ is deflected by a planar reflection mirror $M_3$, which is obliquely arranged at 45° with respect to an optical axis $Ax_1$ of the first lens group $G_1$, via the fifth lens group $G_5$ again, and then becomes incident on a second lens group $G_2$ of negative refractive power. The second lens group $G_2$ comprises a biconvex positive lens $L_{21}$, a biconcave negative lens $L_{22}$, and a positive meniscus lens $L_{23}$ having a convex surface facing the incident side of a light beam, and forms a primary reduced image $I_1$ at its exit side.

The light beam from the primary image $I_1$ is deflected by a planar reflection mirror $M_4$ which is obliquely arranged at 45° with respect to an optical axis $Ax_2$ of the second lens group $G_2$, and reaches a second concave reflection mirror $M_2$ having a magnification larger than unity and a non-spherical shape. The light beam reflected by the second concave reflection mirror $M_2$ becomes incident on a third lens group $G_3$ of positive refractive power. The third lens group $G_3$ comprises a biconvex positive lens $L_{31}$, a biconcave negative lens $L_{32}$, a biconvex positive lens $L_{33}$, a positive meniscus lens $L_{34}$ having a convex surface facing the incident side of a light beam, a positive meniscus lens $L_{35}$ having a convex surface facing the incident side, a negative meniscus lens $L_{36}$ having a convex surface facing the incident side, and a positive meniscus lens $L_{37}$ having a convex surface facing the incident side, and forms a-secondary image $I_2$ in a larger reduction scale than that of the primary image $I_1$. The ninth embodiment has a reduction factor of +0.25 or ¼ as a whole, and achieves a numerical aperture of (N.A.) of 0.5 in a ring-shaped view field centered at an arc having a radius of 24.25 mm from the optical axis.

Table 9 below shows data of the ninth embodiment.

In Table 9, as for the non-spherical reflection surface, only the radius of paraxial curvature is presented, and when a tangential plane at the vertex of a non-spherical surface is considered, a position, where the optical axis passes, on the tangential plane is defined as an origin, and a displacement, in the optical axis direction, of the non-spherical surface at a position of a height y on the tangential plane is represented by x with reference to the vertex of the non-spherical surface while the propagating direction of light is assumed to be the positive direction, the non-spherical surface shape is given by the following equation:

$$x = cy^2/\{1+(1-\kappa c^2 y^2)^{1/2}\} + C_4 y^4 + C_6 y^6 + C_8 y^8 + C_{10} y^{10}$$

where c is the curvature (the reciprocal number of the radius r of curvature) of the non-spherical surface at the vertex of the non-spherical surface, $\kappa$ is a quadrics parameter, and $C_4$, $C_6$, $C_8$, and $C_{10}$ are non-spherical surface coefficients.

In Table 9, the refractive index of each glass material corresponds to that at the wavelength (248 nm) of KrF.

TABLE 9

Ninth Embodiment

| No. | Radius of Curvature | Plane-to-Plane Distance | Refractive Index | | |
|---|---|---|---|---|---|
| | (Object Surface) | 537.071 | 1.0000 | | |
| 1 | −13337.695 | 38.029 | 1.508385 | (quartz) | $L_{11}$ |
| 2 | −559.442 | 0.100 | 1.0000 | | |

TABLE 9-continued

Ninth Embodiment

| No. | Radius of Curvature | Plane-to-Plane Distance | Refractive Index | | |
|---|---|---|---|---|---|
| 3 | 329.313 | 71.406 | 1.508385 | (quartz) | $L_{12}$ |
| 4 | 4423.247 | 0.100 | 1.0000 | | |
| 5 | 208.809 | 57.000 | 1.508385 | (quartz) | $L_{13}$ |
| 6 | 247.488 | 54.831 | 1.0000 | | |
| 7 | 889.869 | 50.000 | 1.508385 | (quartz) | $L_{14}$ |
| 8 | 140.636 | 362.130 | 1.0000 | | |
| 9 | −277.199 | 15.000 | 1.508385 | (quartz) | $G_5$ |
| 10 | −485.421 | 540.415 | 1.0000 | | |
| 11 | −1017.359 | −540.415 | −1.0000 | | $M_1$ |
| 12 | −485.421 | −15.000 | −1.508385 | (quartz) | $G_5$ |
| 13 | −277.199 | −326.174 | −1.0000 | | |
| 14 | −494.427 | −48.250 | −1.508385 | (quartz) | $L_{21}$ |
| 15 | 491.077 | −38.033 | −1.0000 | | |
| 16 | 361.893 | −10.000 | −1.508385 | (quartz) | $L_{22}$ |
| 17 | −260.009 | −40.978 | −1.0000 | | |
| 18 | −279.421 | −17.860 | −1.508385 | (quartz) | $L_{23}$ |
| 19 | −543.231 | −934.426 | −1.0000 | | |
| 20 | 1153.584 | 773.262 | 1.0000 | (non-spherical) | $M_2$ |
| 21 | 187.601 | 29.381 | 1.467877 | (fluorite) | $L_{31}$ |
| 22 | −1450.353 | 6.033 | 1.0000 | | |
| 23 | −391.392 | 9.000 | 1.508385 | (quartz) | $L_{32}$ |
| 24 | 179.475 | 3.183 | 1.0000 | | |
| 25 | 213.669 | 29.199 | 1.467877 | (fluorite) | $L_{33}$ |
| 26 | −621.952 | 0.100 | 1.0000 | | |
| 27 | 137.369 | 29.803 | 1.508385 | (quartz) | $L_{34}$ |
| 28 | 458.595 | 0.100 | 1.0000 | | |
| 29 | 135.180 | 28.421 | 1.467877 | (fluorite) | $L_{35}$ |
| 30 | 268.007 | 0.100 | 1.0000 | | |
| 31 | 121.989 | 16.840 | 1.508385 | (quartz) | $L_{36}$ |
| 32 | 87.217 | 11.990 | 1.0000 | | |
| 33 | 111.525 | 42.765 | 1.467877 | (fluorite) | $L_{37}$ |
| 34 | 841.067 | 19.747 | 1.0000 | | |
| 35 | (Image Surface) | | | | |

<Non-spherical Surface Coefficient>
21st surface (second concave reflection mirror $M_2$)

$\kappa$ 1.0
$C_4$ 0.980896 × 10⁻¹⁰
$C_6$ 0.374676 × 10⁻¹⁵
$C_8$ 0.830862 × 10⁻²¹
$C_{10}$ 0.705084 × 10⁻²⁶

<Condition Corresponding Values>

$\beta_{M2} = -1.733$
$\beta_{M1} = -0.811$
$\beta_{G3} = 0.157$

Figure 14:
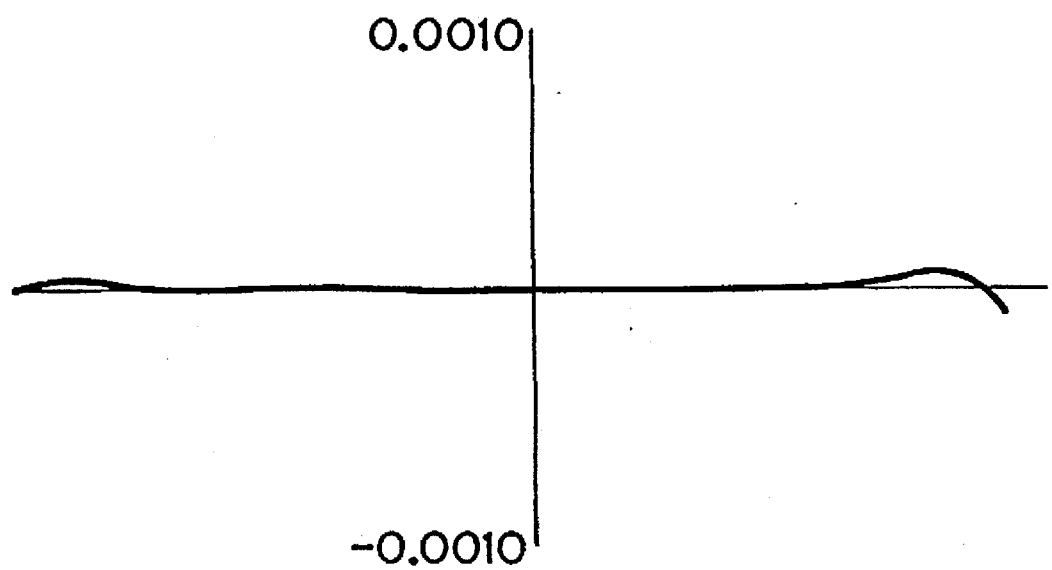
FIG. 14 is a graph showing the coma aberration of the ninth embodiment according to the present invention.

FIG. 14 shows coma of the ninth embodiment. FIG. 14 shows coma in the meridional direction at the center of the ring-shaped view field. As can be seen from FIG. 14, the ninth embodiment maintains an excellent imaging performance.

Figure 15:
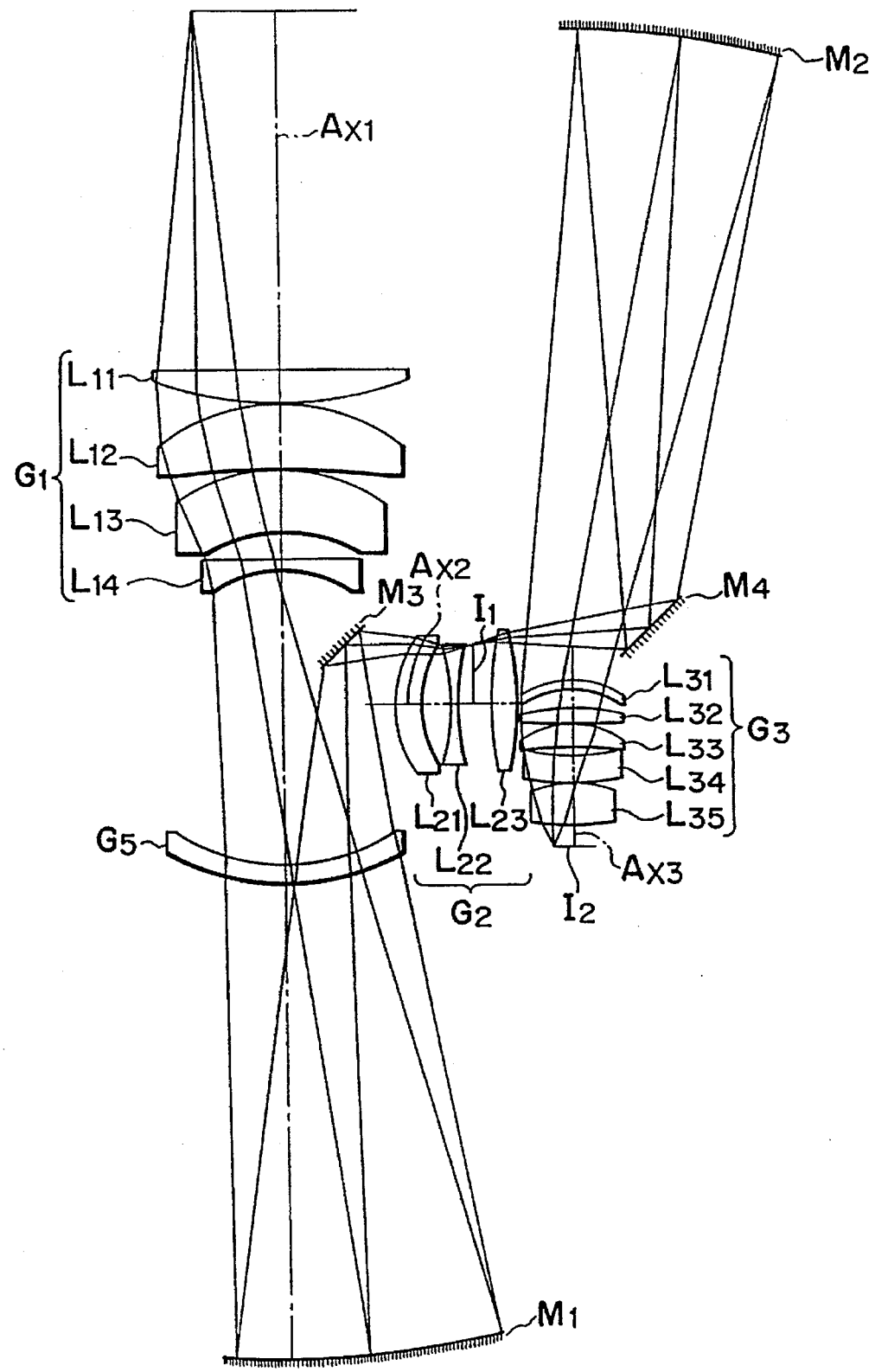
FIG. 15 shows a light path of a 10th embodiment according to the present invention.

A 10th embodiment of the present invention will be described below with reference to FIG. 15. In the 10th embodiment, each of first and second concave reflection mirrors $M_1$ and $M_2$ has a non-spherical reflection surface. Referring to FIG. 15, a light beam from the object surface passes through a first lens group $G_1$ which comprises a biconvex positive lens $L_{11}$, a positive meniscus lens $L_{12}$ having a convex surface facing the incident side of a light beam, a negative meniscus lens $L_{13}$ having a convex surface facing the incident side, and a negative meniscus lens $L_{14}$ having a convex surface facing the incident side, and has positive refractive power as a whole, and then reaches a first concave reflection mirror $M_1$ having a magnification slightly Smaller than unity via a fifth lens group $G_5$ of negative refractive power. The fifth lens group $G_5$ comprises a negative meniscus lens having a convex surface facing the first concave reflection mirror $M_1$ side.

The light beam reflected by the first concave reflection mirror $M_1$ is deflected by a planar reflection mirror $M_3$, which is obliquely arranged at 45° with respect to an optical axis $Ax_1$ of the first lens group $G_1$, via the fifth lens group $G_5$ again, and becomes incident on a second lens group $G_2$ of negative refractive power. The second lens group $G_2$ comprises a negative meniscus lens $L_{21}$ having a convex surface facing the incident side of a light beam, a biconcave negative lens $L_{22}$, and a biconvex positive lens $L_{23}$, and forms a primary image $I_1$ as a reduced image of an object between the negative lens $L_{22}$ and the positive lens $L_{23}$. The light beam emerging from the second lens group $G_2$ is deflected by a planar reflection mirror $M_4$, which is obliquely arranged at 45° with respect to an optical axis $Ax_2$ of the second lens group $G_2$, and reaches a second concave reflection mirror $M_2$ having a magnification larger than unity. The light beam reflected by the second concave reflection mirror $M_2$ is incident on a third lens group $G_3$ of positive refractive power. The third lens group $G_3$ comprises, in succession from the incident side of a light beam, a negative meniscus lens $L_{31}$ having a convex surface facing the object side, a biconvex positive lens $L_{32}$, a positive meniscus lens $L_{33}$ having a convex surface facing the incident side, a negative meniscus lens $L_{34}$ having a concave surface facing the incident side, and a biconvex positive lens $L_{35}$, and forms a secondary image $I_2$ in a larger reduction scale than that of the primary image $I_1$ at the exit side of the third lens group $G_3$.

The 10th embodiment, as well, has a reduction factor of +0.25 or ¼ as a whole, and achieves a numerical aperture of (N.A.) of 0.45 in a ring-shaped view field centered at an arc having a radius of 24.25 mm from the optical axis.

Table 10 below shows data of the 10th embodiment.

Note that the radius of curvature of each of the first and second concave reflection mirrors $M_1$ and $M_2$ shown in Table 10 is the radius of paraxial curvature, and the non-spherical surface coefficients of these first and second reflection mirrors $M_1$ and $M_2$ are separately listed. The refractive index of each glass material corresponds to that at the wavelength (248 nm) of KrF.

TABLE 10

| | 10th Embodiment | | | |
|---|---|---|---|---|
| No. | Radius of Curvature | Plane-to-Plane Distance | Refractive Index | |
| | (Object Surface) | 414.498 | 1.0000 | |
| 1 | 8211.322 | 38.636 | 1.508385 (quartz) | $L_{11}$ |
| 2 | −439.506 | 0.100 | 1.0000 | |
| 3 | 239.531 | 74.172 | 1.508385 (quartz) | $L_{12}$ |
| 4 | 1059.356 | 0.100 | 1.0000 | |
| 5 | 220.874 | 71.349 | 1.508385 (quartz) | $L_{13}$ |
| 6 | 192.087 | 28.244 | 1.0000 | |
| 7 | 9114.936 | 13.285 | 1.508385 (quartz) | $L_{14}$ |
| 8 | 135.907 | 347.569 | 1.0000 | |
| 9 | −236.652 | 19.683 | 1.508385 (quartz) | $G_5$ |
| 10 | −287.731 | 551.277 | 1.0000 | |
| 11 | −1024.933 | −551.277 | −1.0000 | (non-spherical) $M_1$ |
| 12 | −287.731 | −19.683 | −1.508385 (quartz) | $G_5$ |
| 13 | −236.652 | −314.837 | −1.0000 | |
| 14 | −149.845 | −31.308 | −1.508385 (quartz) | $L_{21}$ |
| 15 | −137.269 | −33.137 | −1.0000 | |
| 16 | 257.207 | −10.000 | −1.508385 (quartz) | $L_{22}$ |
| 17 | −315.674 | −37.792 | −1.0000 | |
| 18 | −459.634 | −27.954 | −1.508385 (quartz) | $L_{23}$ |
| 19 | 431.125 | −848.560 | −1.0000 | |
| 20 | 1044.120 | 752.496 | 1.0000 | (non-spherical) $M_2$ |
| 21 | 106.792 | 12.000 | 1.508385 (quartz) | $L_{31}$ |
| 22 | 105.550 | 24.044 | 1.0000 | |
| 23 | 344.933 | 16.641 | 1.508385 (quartz) | $L_{32}$ |
| 24 | −1397.225 | 0.100 | 1.0000 | |
| 25 | 105.435 | 30.284 | 1.508385 (quartz) | $L_{33}$ |
| 26 | 890.603 | 8.066 | 1.0000 | |
| 27 | −297.345 | 32.551 | 1.508385 (quartz) | $L_{34}$ |
| 28 | −486.516 | 1.643 | 1.0000 | |
| 29 | 154.666 | 44.945 | 1.508385 (quartz) | $L_{35}$ |
| 30 | −706.316 | 24.770 | 1.0000 | |
| 31 | (Image Surface) | | | |

<Non-spherical Surface Coefficient>
11th surface (first concave reflection mirror $M_1$)

$\kappa$   1.0
$C_4$   $-0.395493 \times 10^{-12}$
$C_6$   $-0.168923 \times 10^{-16}$
$C_8$   $-0.338178 \times 10^{-22}$
$C_{10}$   $-0.134005 \times 10^{-26}$ 20th surface (second concave reflection mirror $M_2$)

$\kappa$   1.0
$C_4$   $0.340990 \times 10^{-10}$
$C_6$   $0.116056 \times 10^{-15}$
$C_8$   $0.245212 \times 10^{-21}$
$C_{10}$   $0.260273 \times 10^{-26}$ <Condition Corresponding Values>

$\beta_{M2} = -1.357$
$\beta_{M1} = -0.800$
$\beta_{G3} = 0.238$

Figure 16:
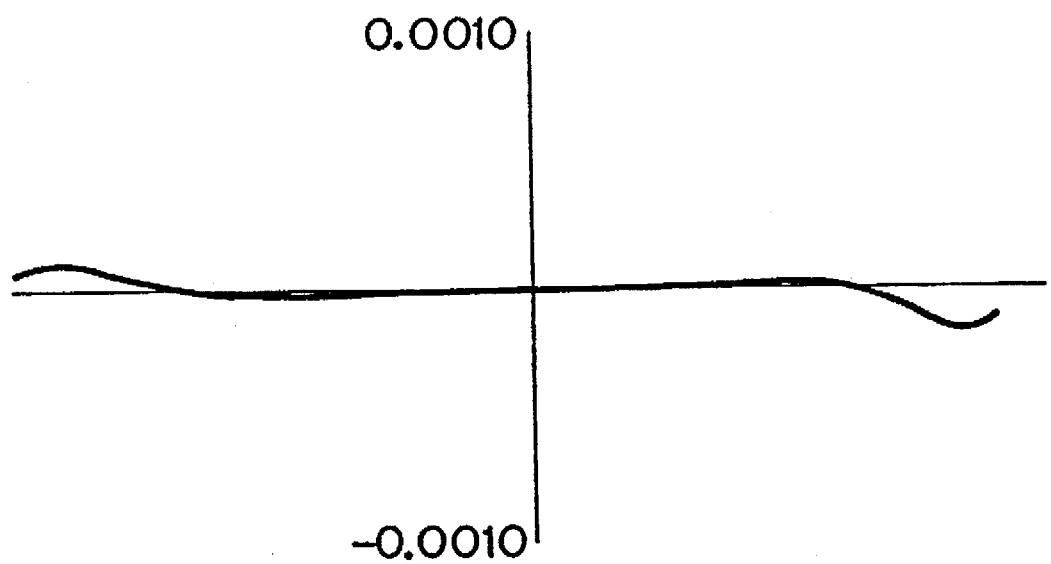
FIG. 16 is a graph showing the coma aberration of the 10th embodiment according to the present invention.

FIG. 16 shows coma of the 10th embodiment. FIG. 16 shows coma in the meridional direction at the center of the ring-shaped view field. As can be seen from FIG. 16, the 10th embodiment maintains an excellent imaging performance.

Figure 17:
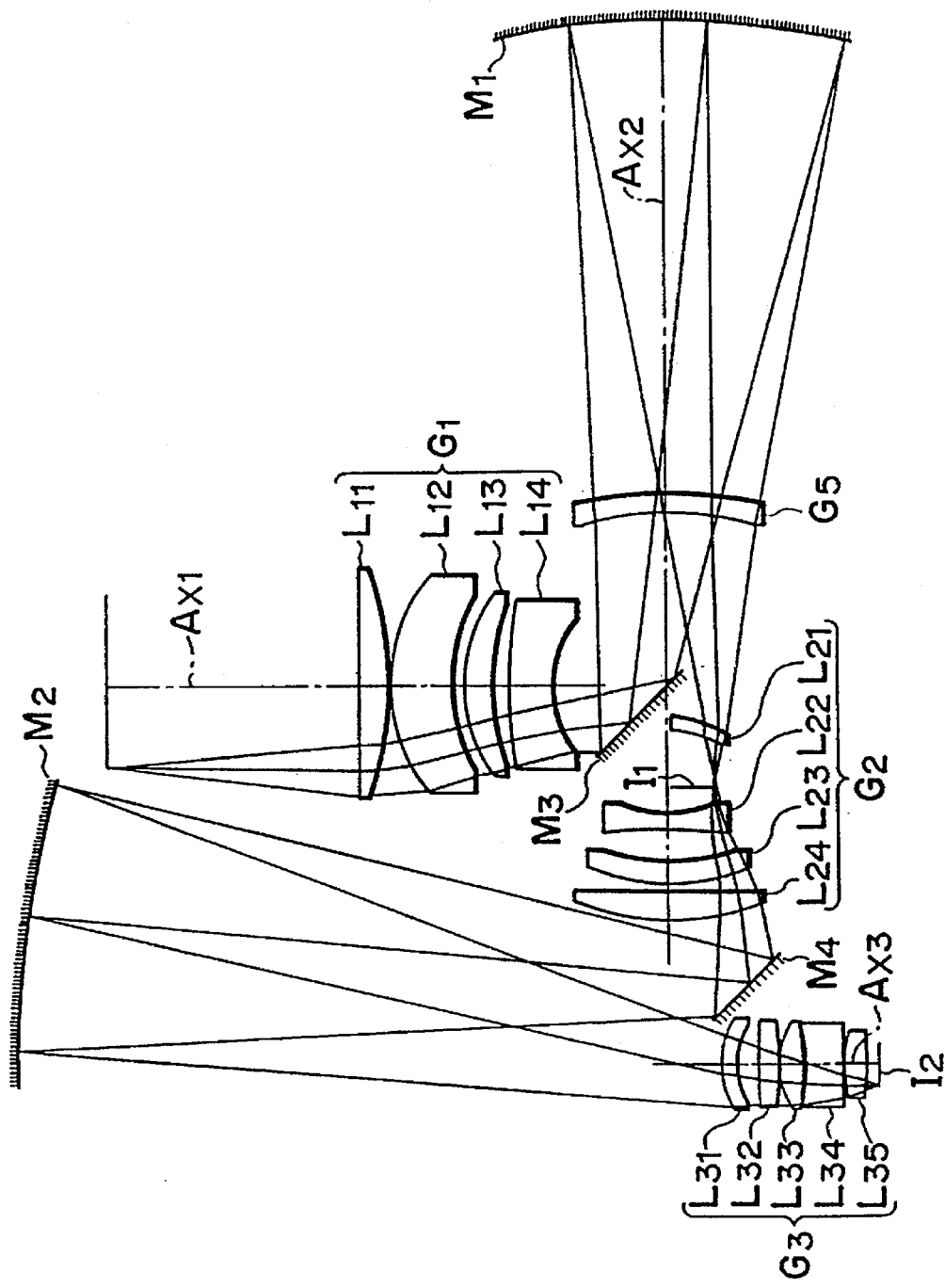
FIG. 17 shows a light path of an 11th embodiment according to the present invention.

An 11th embodiment of the present invention will be described below with reference to FIG. 17. Referring to FIG. 17, a light beam from the object surface emerges from a first lens group $G_1$ which comprises a biconvex positive lens $L_{11}$, a positive meniscus lens $L_{12}$ having a convex surface facing the incident side of a light beam, a positive meniscus lens $L_{13}$ having a convex surface facing the incident side of a light beam, and a negative meniscus lens $L_{14}$ having a convex surface facing the incident side, and has positive refractive power as a whole, and is deflected by a planar reflection mirror $M_3$ which is obliquely arranged at 45° with respect to an optical axis $Ax_1$ of the first lens group $G_1$. The deflected light beam reaches a first concave reflection mirror $M_1$ having a magnification slightly smaller than unity via a fifth lens group $G_5$ of negative refractive power. The fifth lens group $G_5$ comprises a negative meniscus lens having a convex surface facing the first concave reflection mirror $M_1$. The light beam reflected by the first concave reflection mirror $M_1$ is incident on a second lens group $G_2$ of negative refractive power via the second lens group $G_5$ again. The second lens group $G_2$ comprises a negative meniscus lens $L_{21}$ having a convex surface facing the incident side of a light beam, a biconcave negative lens $L_{22}$, a positive meniscus lens $L_{23}$ having a concave surface facing the incident side, and a positive meniscus lens $L_{24}$ having a concave surface facing the incident side, and forms a primary image $I_1$ as a reduced image of an object in the light path between the negative lenses $L_{21}$ and $L_{22}$. Note that the negative lens $L_{21}$ in the second lens group is arranged at only one side of the optical axis $Ax_2$ so as not to shield the light path extending from the first lens group $G_1$ toward the first concave reflection mirror $M_1$.

The light beam emerging from the second lens group $G_2$ is deflected by a planar reflection mirror $M_4$ which is obliquely arranged at 45° with respect to the optical axis $Ax_2$ of the second lens group $G_2$, is reflected by a second concave reflection mirror $M_2$ having a magnification larger than unity, and then becomes incident on a third lens group $G_3$ of positive refractive power. The third lens group $G_3$ comprises a negative meniscus lens $L_{31}$ having a convex surface facing the incident side of a light beam, a biconvex positive lens $L_{32}$, a positive meniscus lens $L_{33}$ having a convex surface facing the incident side, a biconcave negative lens $L_{34}$, and a biconvex positive lens $L_{35}$, and forms a secondary image $I_2$ in a larger reduction scale than that of the primary image $I_1$.

The 11th embodiment has a reduction factor of +0.25 or ¼ as a whole, and achieves a numerical aperture of (N.A.) of 0.4 in a ring-shaped view field centered at an arc having a radius of 25 mm from the optical axis.

Table 11 below shows data of the 11th embodiment.

In Table 11, the refractive index of each glass material corresponds to that at the wavelength (193 nm) of ArF.

TABLE 11

11th Embodiment

| No. | Radius of Curvature | Plane-to-Plane Distance | Refractive Index | | |
|---|---|---|---|---|---|
|  | (Object Surface) | 298.019 | 1.0000 | | |
| 1 | 4860.661 | 33.000 | 1.501375 | (fluorite) | $L_{11}$ |
| 2 | −410.727 | 0.100 | 1.0000 | | |
| 3 | 202.797 | 73.000 | 1.501375 | (fluorite) | $L_{12}$ |
| 4 | 221.645 | 12.851 | 1.0000 | | |
| 5 | 189.285 | 33.370 | 1.501375 | (fluorite) | $L_{13}$ |
| 6 | 308.080 | 19.873 | 1.0000 | | |
| 7 | 942.449 | 50.409 | 1.560194 | (quartz) | $L_{14}$ |
| 8 | 133.378 | 326.305 | 1.0000 | | |
| 9 | −409.199 | 21.087 | 1.501375 | (fluorite) | $G_5$ |
| 10 | −618.117 | 538.975 | 1.0000 | | |
| 11 | −918.138 | −538.975 | −1.0000 | | $M_1$ |
| 12 | −618.117 | −21.087 | −1.501375 | (fluorite) | $G_5$ |
| 13 | −409.199 | −230.534 | −1.0000 | | |
| 14 | −124.583 | −16.666 | −1.501375 | (fluorite) | $L_{21}$ |
| 15 | −122.761 | −99.533 | −1.0000 | | |
| 16 | 139.122 | −17.104 | −1.501375 | (fluorite) | $L_{22}$ |
| 17 | −708.717 | −35.132 | −1.0000 | | |
| 18 | 253.980 | −28.131 | −1.501375 | (fluorite) | $L_{23}$ |
| 19 | 225.928 | −6.072 | −1.0000 | | |
| 20 | 14003.190 | −33.317 | −1.560194 | (quartz) | $L_{24}$ |
| 21 | 290.144 | −904.186 | −1.0000 | | |
| 22 | 1085.235 | 804.185 | 1.0000 | | $M_2$ |
| 23 | 95.505 | 18.738 | 1.560194 | (quartz) | $L_{31}$ |
| 24 | 92.560 | 23.254 | 1.0000 | | |
| 25 | 1178.101 | 22.112 | 1.501375 | (fluorite) | $L_{32}$ |
| 26 | −788.023 | 0.100 | 1.0000 | | |
| 27 | 86.141 | 27.769 | 1.501375 | (fluorite) | $L_{33}$ |
| 28 | 734.979 | 1.972 | 1.0000 | | |
| 29 | −322.980 | 43.543 | 1.560194 | (quartz) | $L_{34}$ |
| 30 | 926.558 | 0.100 | 1.0000 | | |
| 31 | 125.704 | 23.783 | 1.501375 | (fluorite) | $L_{35}$ |
| 32 | −725.241 | 15.000 | 1.0000 | | |
| 33 | (Image Surface) | | | | |

TABLE 11-continued

11th Embodiment

| No. | Radius of Curvature | Plane-to-Plane Distance | Refractive Index |
|---|---|---|---|

<Condition Corresponding Values>

$\beta_{M2} = -0.993$
$\beta_{M1} = -0.814$
$\beta_{G3} = 0.373$

Figure 18:
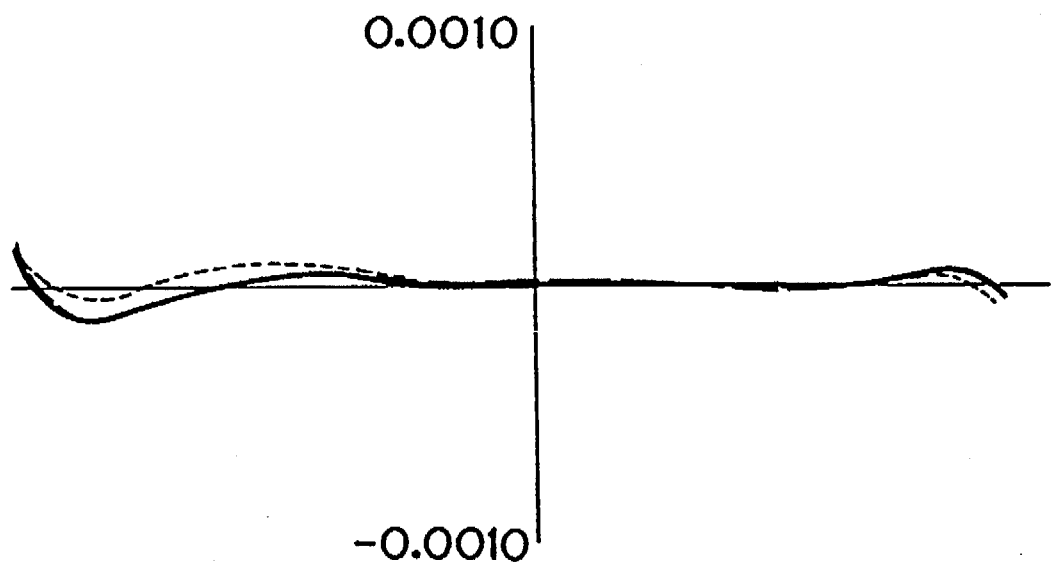
FIG. 18 is a graph showing the coma aberration of the 11th embodiment according to the present invention.

FIG. 18 shows coma of the 11th embodiment. FIG. 18 shows coma in the meridional direction at the center of the ring-shaped view field. Note that a solid curve in FIG. 18 represents coma at 193.3 nm, a broken curve represents coma at 193.7 nm, and a dotted curve represents coma at 192.9 nm. As can be seen from FIG. 18, the 11th embodiment can achieve correction of chromatic aberration within a range of ±0.4 nm at the wavelength of ArF, and maintains art excellent imaging performance.

Figure 19:
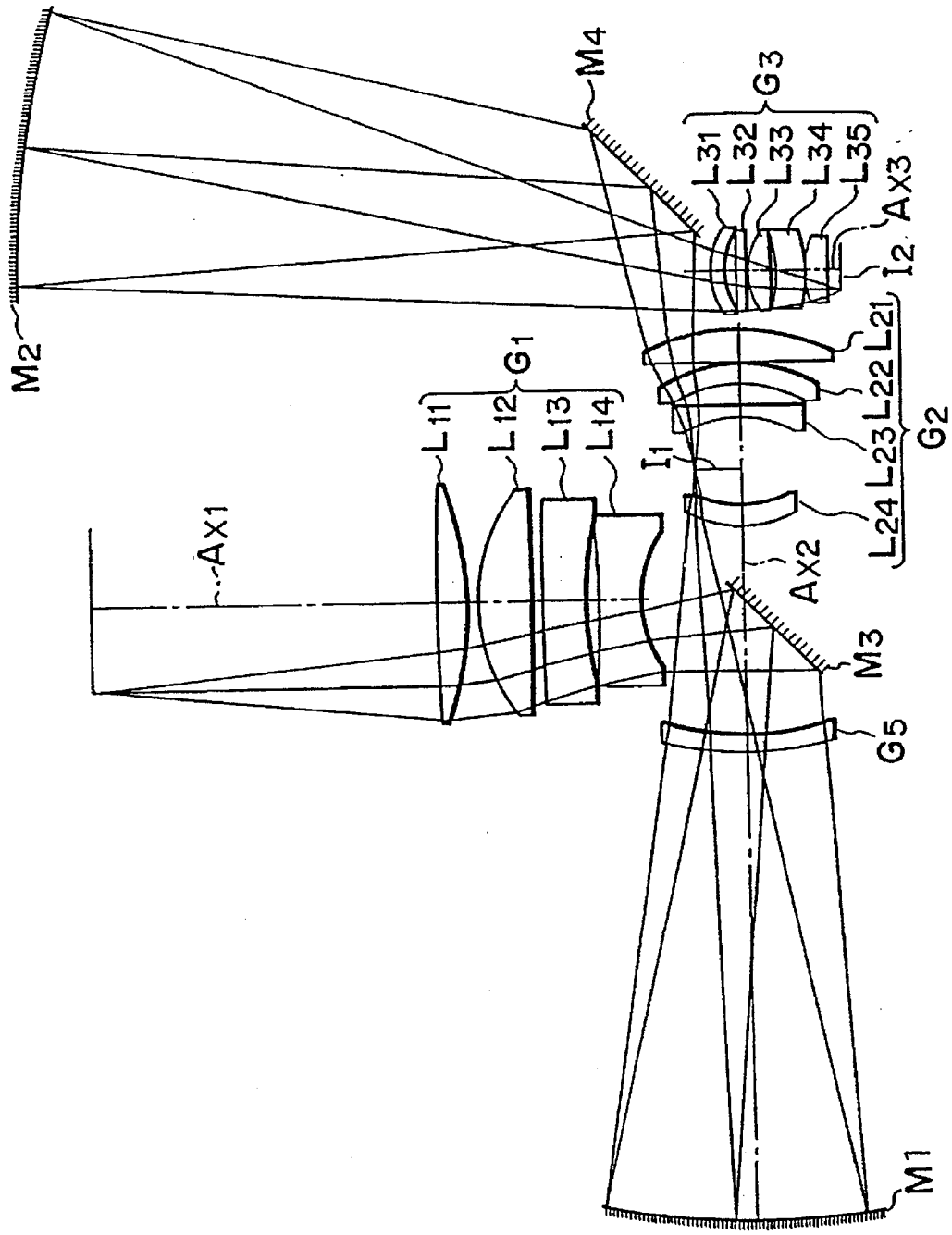
FIG. 19 shows a light path of a 12th embodiment according to the present invention.

A 12th embodiment of the present invention will be described below with reference to FIG. 19. Referring to FIG. 19, a light beam from the object surface passes through a first lens group $G_1$ which comprises a biconvex positive lens $L_{11}$, a biconvex positive lens $L_{12}$, a negative meniscus lens $L_{13}$ having a convex surface facing the incident side of a light beam, and a biconcave negative lens $L_{14}$, and which has positive refractive power as a whole, and is then deflected by a planar reflection mirror $M_3$ which is obliquely arranged at 45° with respect to an optical axis $Ax_1$ of the first lens group $G_1$. The deflected light beam reaches a first concave reflection mirror $M_1$ having a magnification slightly smaller than unity via a fifth lens group $G_5$ of negative refractive power. The fifth lens group $G_5$ comprises a negative meniscus lens having a convex surface facing the first concave reflection mirror $M_1$ side. The light beam reflected by the first concave reflection mirror $M_1$ is incident on a second lens group $G_2$ of negative refractive power via the fifth lens group $G_5$ again. The second lens group $G_2$ comprises a negative meniscus lens $L_{21}$ having a convex surface facing the incident side of a light beam, a negative meniscus lens $L_{22}$ having a concave surface facing the incident side, a negative meniscus lens $L_{23}$ having a concave surface facing the incident side, and a biconvex positive lens $L_{24}$, and forms a primary reduced image $I_1$ between the negative lenses $L_{21}$ and $L_{22}$.

The light beam emerging from the second lens group $G_2$ is deflected by a planar reflection mirror $M_4$ which is obliquely arranged at 45° with respect to an optical axis $Ax_2$ of the second lens group $G_2$, is reflected by a second concave reflection mirror $M_2$ having a magnification larger than unity, and then becomes incident on a third lens group $G_3$ of positive refractive power. The third lens group $G_3$ comprises a negative meniscus lens $L_{31}$ having a convex surface facing the incident side of a light beam, a biconvex positive lens $L_{32}$, a biconvex positive lens $L_{33}$, a negative meniscus lens $L_{34}$ having a concave surface facing the incident side, and a positive meniscus lens $L_{35}$ having a convex surface facing the incident side, and forms a secondary image $I_2$ in a larger reduction scale than that of the primary image $I_1$ at its exit side.

The 12th embodiment has a reduction factor of +0.25 or ¼ as a whole, and achieves a numerical aperture of (N.A.) of 0.4 in a ring-shaped view field entered at an arc having a radius of 24.25 mm from the optical axis.

Table 12 below shows data of the 12th embodiment.

In Table 12, the refractive index of each glass material corresponds to that at the wavelength (248 nm) of KrF.

TABLE 12

12th Embodiment

| No. | Radius of Curvature | Plane-to-Plane Distance | Refractive Index | | |
|---|---|---|---|---|---|
|  | (Object Surface) | 400.975 | 1.0000 | | |
| 1 | 3191.354 | 33.000 | 1.508385 | (quartz) | $L_{11}$ |
| 2 | −448.984 | 15.428 | 1.0000 | | |
| 3 | 223.181 | 64.645 | 1.508385 | (quartz) | $L_{12}$ |
| 4 | −4151.509 | 12.219 | 1.0000 | | |
| 5 | 11253.765 | 49.299 | 1.508385 | (quartz) | $L_{13}$ |
| 6 | 461.799 | 16.133 | 1.0000 | | |
| 7 | −1336.016 | 48.239 | 1.508385 | (quartz) | $L_{14}$ |
| 8 | 158.062 | 281.551 | 1.0000 | | |
| 9 | −312.940 | 20.065 | 1.508385 | (quartz) | $G_5$ |
| 10 | −441.735 | 538.318 | 1.0000 | | |
| 11 | −919.752 | −538.318 | −1.0000 | | $M_1$ |
| 12 | −441.735 | −20.065 | −1.508385 | (quartz) | $G_5$ |
| 13 | −312.940 | −247.755 | −1.0000 | | |
| 14 | −132.399 | −22.942 | −1.508385 | (quartz) | $L_{21}$ |
| 15 | −127.754 | −104.702 | −1.0000 | | |
| 16 | 134.695 | −14.420 | −1.508385 | (quartz) | $L_{22}$ |
| 17 | 11180.397 | −23.490 | −1.0000 | | |
| 18 | 160.735 | −29.211 | −1.508385 | (quartz) | $L_{23}$ |
| 19 | 163.686 | −0.100 | −1.0000 | | |
| 20 | 1939.060 | −37.447 | −1.508385 | (quartz) | $L_{24}$ |
| 21 | 239.738 | −905.619 | −1.0000 | | |
| 22 | 1073.545 | 806.574 | 1.0000 | | $M_2$ |
| 23 | 89.424 | 16.314 | 1.508385 | (quartz) | $L_{31}$ |
| 24 | 82.394 | 13.739 | 1.0000 | | |
| 25 | 612.232 | 15.000 | 1.508385 | (quartz) | $L_{32}$ |
| 26 | −1320.781 | 0.100 | 1.0000 | | |
| 27 | 86.666 | 25.509 | 1.508385 | (quartz) | $L_{33}$ |
| 28 | −1224.142 | 4.770 | 1.0000 | | |
| 29 | −224.139 | 36.310 | 1.508385 | (quartz) | $L_{34}$ |
| 30 | −236.345 | 0.589 | 1.0000 | | |
| 31 | 165.225 | 24.171 | 1.508385 | (quartz) | $L_{35}$ |
| 32 | 43423.922 | 15.000 | 1.0000 | | |
| 33 | (Image Surface) | | | | |

<Condition Corresponding Values>

$\beta_{M2} = -0.934$
$\beta_{M1} = -0.797$
$\beta_{G3} = 0.400$

Figure 20:
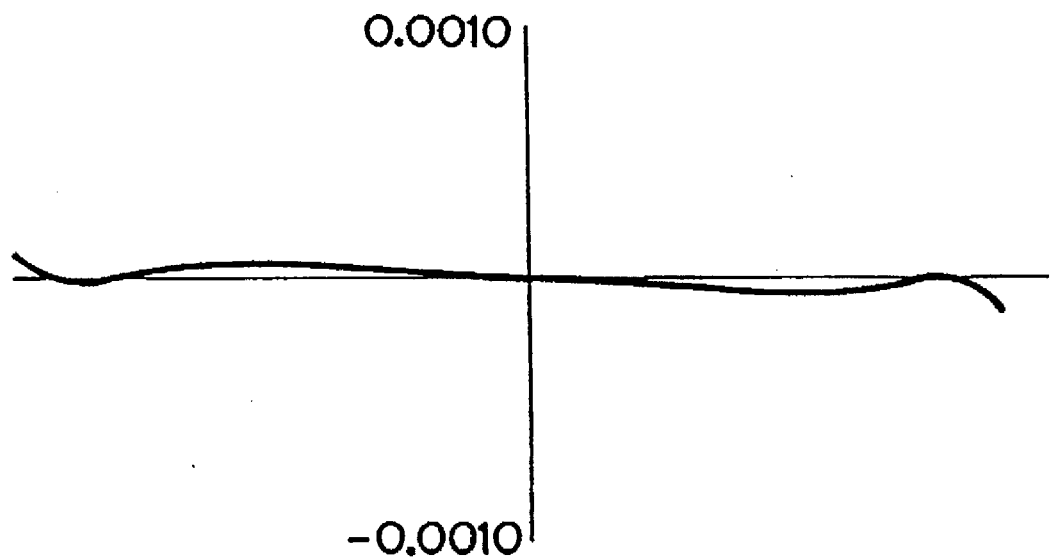
FIG. 20 is a graph showing the coma aberration of the 12th embodiment according to the present invention.

FIG. 20 shows coma of the 12th embodiment. FIG. 20 shows coma in the meridional direction at the center of the ring-shaped view field. As can be seen from FIG. 20, the 12th embodiment maintains an excellent imaging performance.

In each of the above embodiments, the primary image formed by the first partial optical system (the first lens group $G_1$ and the first concave reflection mirror $M_1$) is a reduced image. However, the primary image formed by the first partial optical system is not limited to a reduced image.

In each of the above embodiments, since the optical system is constituted to satisfy the above-mentioned conditions, the optical members constituting the catadioptric reduction projection optical system do not interfere with each other. Therefore, a physically constructible catadioptric reduction projection optical system can be obtained.

In each of the fifth to 12th embodiments, the optical system is preferably constituted to satisfy:

$$-2.0 < \beta_{M1} < -0.7$$

where $B_{M1}$ is the magnification of the first concave reflection mirror $M_1$.

In each of the sixth to 12th embodiments, the object surface is set to be parallel to the image surface using the two planar reflection mirrors. Thus, when the catadioptric reduction projection optical system of each of the second to 12th embodiments is adopted as an optical system of a scanning exposure apparatus, a convey mechanism for executing scanning exposure can be simplified.

In each of the second, third, fourth, and seventh embodiments, since the lens groups of the catadioptric reduction projection optical system are constituted by two different optical members, chromatic aberration is corrected.

Figure 21:
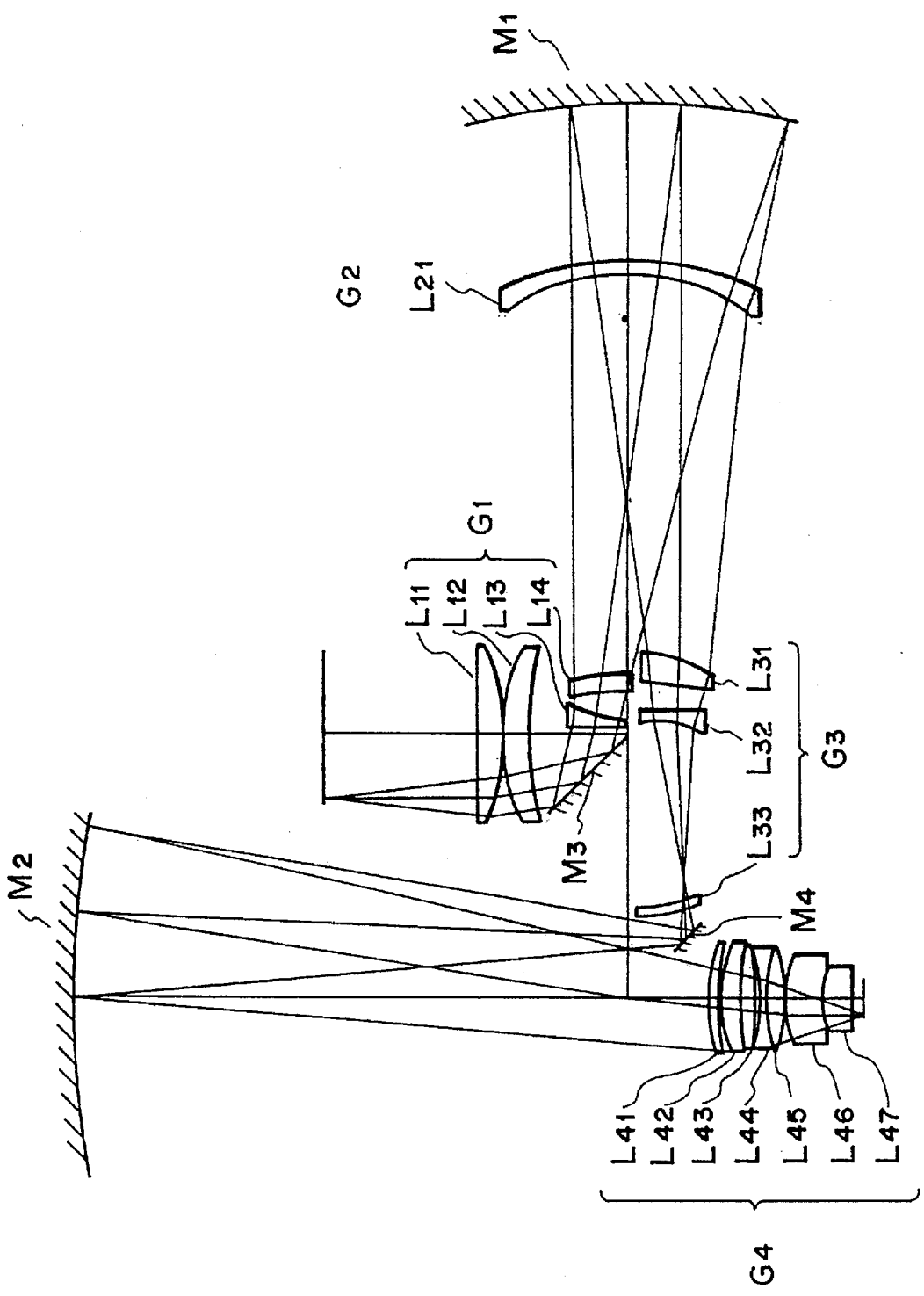
FIG. 21 shows a light path of a 13th embodiment of a catadioptric reduction projection optical system of the present invention.

Still other preferred embodiments of the present invention will be described below. FIG. 21 shows a light path of a 13th embodiment of the present invention. As shown in FIG. 21, a light beam from the object surface passes through a first lens group $G_1$ of positive refractive power, and its light path is bent by a planar reflection mirror $M_3$. The light beam passes through a second lens group $G_2$ and is reflected by a first concave reflection mirror $M_1$ having a magnification slightly smaller than unity magnification.

The first lens group $G_1$ comprises a plano-convex positive lens $L_{11}$ having a planar surface facing the object surface, a positive meniscus lens $L_{12}$ having a convex surface facing the object side, a negative meniscus lens $L_{13}$ having a convex surface facing the object side, and a positive meniscus lens $L_{14}$ having a concave surface facing the incident side. The planar reflection mirror $M_3$ is disposed between the positive meniscus lens $L_{12}$ and the negative meniscus lens $L_{13}$.

The second lens group $G_2$ is disposed between the first lens group $G_1$ and the first concave reflection mirror $M_1$, and comprises a negative meniscus lens $L_{21}$ having a convex surface facing the first concave reflection mirror $M_1$ side.

The first lens group $G_1$ mainly functions to correct distortion and to maintain telecentric characteristics. The second lens group $G_2$ mainly functions to correct coma of high orders generated by the first and second concave reflection mirrors $M_1$ and $M_2$.

The light beam reflected by the first concave reflection mirror $M_1$ passes through the second lens group $G_2$ to form a primary reduced image $I_1$ between a negative meniscus lens $L_{32}$ and a positive meniscus lens $L_{33}$. A third lens group $G_3$ comprises a positive meniscus lens $L_{31}$ having a convex surface facing the first concave reflection mirror $M_1$ side, the negative almost plano-concave lens $L_{32}$ having a concave surface facing the primary image $I_1$ side, and the positive meniscus lens $L_{33}$ of weak refractive power having a concave surface facing the primary image $I_1$ side. The third lens group $G_3$ functions to correct distortion and curvature of field, and functions as a field lens.

After the light path of the light beam is bent by a planar reflection mirror $M_4$, the light beam emerging from the third lens group $G_3$ is reflected by the second concave reflection mirror $M_2$. The light beam reflected by the second concave reflection mirror $M_2$ is incident on a fourth lens group $G_4$ of positive refractive power. The fourth lens group $G_4$ comprises, in succession from the incident side of a light beam, positive meniscus lenses $L_{41}$ and $L_{42}$ each having a convex surface facing the second concave reflection mirror $M_2$ side, a biconvex lens $L_{43}$, a biconcave lens $L_{44}$, a biconvex lens $L_{45}$, a negative meniscus lens $L_{46}$ having a convex surface facing the second concave reflection mirror $M_2$ side, and a positive meniscus lens $L_{47}$ having a convex surface facing the second concave reflection mirror $M_2$ side. The fourth lens group $G_4$ forms a secondary image $I_2$ in a larger reduction scale than that of the primary image $I_1$.

At this time, only part of each of the negative meniscus lens $L_{13}$ and the positive meniscus lens $L_{14}$ in the first lens group $G_1$ and the positive meniscus lens $L_{31}$ and the negative meniscus lens $L_{32}$ in the third lens group $G_3$ is used so as not to shield opposing light paths. Like the negative meniscus lens $L_{13}$, the positive meniscus lens $L_{14}$, the positive meniscus lens $L_{31}$, and the negative meniscus lens $L_{32}$, part of the positive meniscus lens $L_{33}$ in the third lens group is used so as not to shield a light beam bent by the planar reflection mirror $M_4$.

The 13th embodiment has a reduction factor of +0.25 or ¼ as a whole, and achieves a numerical aperture (N.A.) of 0.45 in a ring-shaped view field centered on a wafer having a radius of 20 mm from the optical axis. The center and spread of wavelengths of a light source used for illumination are $\lambda=217\pm4$ nm.

Data of the 13th embodiment are shown in Table 13 below.

In Table 13, signs of the refractive index and the plane-to-plane distance are inverted by the reflection by the concave reflection mirror. The refractive index of each glass material corresponds to that at the center wavelength (217 nm). The positions of the planar reflection mirrors $M_3$ and $M_4$ for bending an optical path are omitted since they are not essential in the optical design.

TABLE 13

Data of 13th Embodiment

| No. | Radius of Curvature | Plane-to-Plane Distance | Refractive Index | | |
|---|---|---|---|---|---|
|  | (Object Surface) | 195.426 | 1.0000 | | |
| 1 | ∞ | 28.240 | 1.53126 | (quartz) | $L_{11}$ |
| 2 | −357.547 | 0.100 | 1.0000 | | |
| 3 | 230.557 | 40.000 | 1.53126 | (quartz) | $L_{12}$ |
| 4 | 511.280 | 127.690 | 1.0000 | | |
| 5 | 878.395 | 15.000 | 1.53126 | (quartz) | $L_{13}$ |
| 6 | 147.119 | 30.000 | 1.0000 | | |
| 7 | −460.235 | 21.395 | 1.53126 | (quartz) | $L_{14}$ |
| 8 | −331.076 | 503.034 | 1.0000 | | |
| 9 | −249.818 | 20.000 | 1.53126 | (quartz) | $L_{21}$ |
| 10 | −339.471 | 197.664 | 1.0000 | | |
| 11 | −788.338 | −197.664 | −1.0000 | | $M_1$ |
| 12 | −339.471 | −20.000 | −1.53126 | (quartz) | $L_{21}$ |
| 13 | −249.818 | −476.065 | −1.0000 | | |
| 14 | −190.475 | −35.000 | −1.53126 | (quartz) | $L_{31}$ |
| 15 | −519.430 | −34.164 | −1.0000 | | |
| 16 | −5178.591 | −15.000 | −1.48295 | (fluorite) | $L_{32}$ |
| 17 | −168.466 | −237.584 | −1.0000 | | |
| 18 | 210.704 | −9.790 | −1.53126 | (quartz) | $L_{33}$ |
| 19 | 200.000 | −800.100 | −1.0000 | | |
| 20 | 1107.209 | 800.100 | 1.0000 | | $M_2$ |
| 21 | 198.147 | 14.809 | 1.48295 | (fluorite) | $L_{41}$ |
| 22 | 372.888 | 0.100 | 1.0000 | | |
| 23 | 129.330 | 25.653 | 1.53126 | (quartz) | $L_{42}$ |
| 24 | 557.405 | 0.100 | 1.0000 | | |
| 25 | 444.552 | 14.301 | 1.48295 | (fluorite) | $L_{43}$ |
| 26 | −3249.866 | 7.298 | 1.0000 | | |
| 27 | −295.228 | 8.000 | 1.53126 | (quartz) | $L_{44}$ |
| 28 | 206.396 | 0.100 | 1.0000 | | |
| 29 | 206.202 | 25.530 | 1.48295 | (fluorite) | $L_{45}$ |
| 30 | −284.380 | 0.100 | 1.0000 | | |
| 31 | 141.752 | 45.000 | 1.53126 | (quartz) | $L_{46}$ |
| 32 | 72.518 | 1.447 | 1.0000 | | |
| 33 | 80.818 | 40.000 | 1.53126 | (quartz) | $L_{47}$ |
| 34 | −1726.119 | 15.000 | 1.0000 | | |

<Condition Corresponding Values>

$\beta_{M1} = -0.959$
$\beta_{M2} = -1.646$
$\beta_{G4} = 0.178$

FIG. 22 shows coma for explaining the imaging performance of the 13th embodiment. FIG. 22 shows coma in the meridional and sagittal directions at the center of the ring-shaped view field. A broken curve represents coma at 213 nm, a solid curve represents come at 217 nm, and a dotted curve represents coma at 221 nm. As can be seen from FIG. 22, the catadioptric reduction projection optical system of the 13th embodiment performs correction of aberration within this range, and has an excellent imaging performance.

Figure 23:
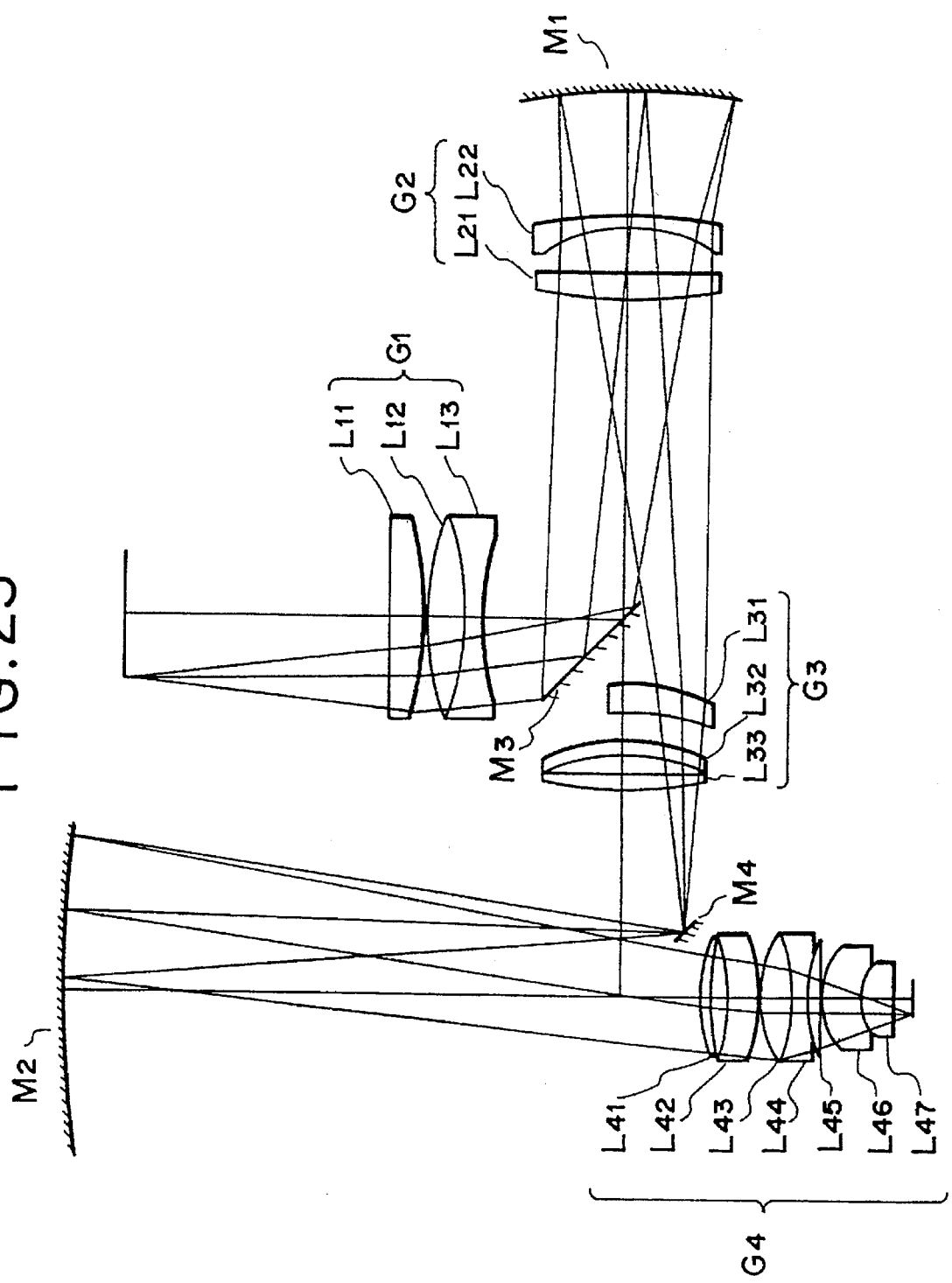
FIG. 23 shows a light path of a 14th embodiment of a catadioptric reduction projection optical system of the present invention.

The 14th embodiment will be described below with reference to FIG. 23. As shown in FIG. 23, a light beam from the object surface passes through a first lens group $G_1$ of positive refractive power, and its light path is bent by a planar reflection mirror $M_3$. The light beam passes through a second lens group $G_2$ and is reflected by a first concave reflection mirror $M_1$ having a magnification slightly smaller than unity magnification. The first lens group $G_1$ comprises a plano-convex positive lens $L_{11}$ having its planar surface facing the object surface, a positive biconvex lens $L_{12}$, and a negative biconcave lens $L_{13}$. The second lens group $G_2$ is disposed between the first lens group $G_1$ and the first concave reflection mirror $M_1$, and comprises a positive plano-convex lens $L_{21}$ having a convex surface facing the planar reflection mirror $M_3$ side, and a negative meniscus lens $L_{22}$ having a convex surface facing the first concave reflection mirror $M_1$ side.

The first lens group $G_1$ mainly functions to correct distortion and to maintain telecentric characteristics. The second lens group $G_2$ mainly functions to correct coma of high orders generated by the first and second concave reflection mirrors $M_1$ and $M_2$.

The light beam reflected by the first concave reflection mirror $M_1$ passes through the third lens group $G_3$ via the second lens group $G_2$ to form a primary reduced image $I_1$. The third lens group $G_3$ comprises a positive meniscus lens $L_{31}$ having a convex surface facing the first concave reflection mirror side, a negative meniscus lens $L_{32}$ having a concave surface facing the primary image $I_1$ side, and a biconvex lens $L_{33}$. The third lens group $G_3$ functions to correct distortion and curvature of field, and functions as a field lens.

After the light path of the light beam is bent by a planar reflection mirror $M_4$, the light beam emerging from the third lens group $G_3$ is reflected by the second concave reflection mirror $M_2$ and is incident on a fourth lens group $G_4$ of positive refractive power. The fourth lens group $G_4$ comprises, in succession from the incident side of a light beam, a positive meniscus lens $L_{41}$ having a convex lens facing the second concave reflection mirror $M_2$ side, a negative meniscus lens $L_{42}$ having a concave surface facing the second concave reflection mirror $M_2$ side, a biconvex lens $L_{43}$, a biconcave lens $L_{44}$, a positive meniscus lens $L_{45}$ having a convex surface facing the second concave reflection mirror $M_2$ side, a negative meniscus lens $L_{46}$ having a convex surface facing the second concave reflection mirror $M_2$ side, and a positive meniscus lens $L_{47}$ having a convex surface facing the second concave reflection mirror $M_2$ side. The fourth lens group $G_4$ forms a secondary image $I_2$ in a larger reduction scale than that of the primary image $I_1$.

At this time, only part of each of the biconcave lens $L_{13}$ in the first lens group $G_1$ and the planar reflection mirror $M_3$ is used so as not to shield opposing light paths.

The 14th embodiment has a reduction factor of +0.25 or ¼ as a whole, and achieves a numerical aperture (N.A.) of 0.45 in a ring-shaped view field centered on a wafer having a radius of 20 mm from the optical axis. The center and spread of wavelengths of a light source used for illumination are $\lambda=217\pm4$ nm.

Data of the 14th embodiment are shown in Table 14 below.

In Table 14, signs of the refractive index and the plane-to-plane distance are inverted by the reflection by the concave reflection mirror. The refractive index of each glass material corresponds to that at the center wavelength (217 nm). The positions of the planar reflection mirrors $M_3$ and $M_4$ for bending an optical path are omitted since they are not essential in the optical design.

TABLE 14

Data of 14th Embodiment

| No. | Radius of Curvature | Plane-to-Plane Distance | Refractive Index | | |
|---|---|---|---|---|---|
|  | (Object Surface) | 326.189 | 1.0000 | | |
| 1 | ∞ | 40.000 | 1.53126 | (quartz) | $L_{11}$ |
| 2 | −509.905 | 0.500 | 1.0000 | | |
| 3 | 290.348 | 57.790 | 1.53126 | (quartz) | $L_{12}$ |
| 4 | −302.026 | 1.115 | 1.0000 | | |
| 5 | −297.387 | 15.000 | 1.53126 | (quartz) | $L_{13}$ |
| 6 | 291.877 | 584.373 | 1.0000 | | |
| 7 | 900.000 | 30.000 | 1.53126 | (quartz) | $L_{21}$ |
| 8 | ∞ | 50.000 | 1.0000 | | |
| 9 | −225.015 | 20.000 | 1.53126 | (quartz) | $L_{22}$ |
| 10 | −550.380 | 155.364 | 1.0000 | | |
| 11 | −714.562 | −155.364 | −1.0000 | | $M_1$ |
| 12 | −550.380 | −20.000 | −1.53126 | (quartz) | $L_{22}$ |
| 13 | −225.015 | −50.000 | −1.0000 | | |
| 14 | ∞ | −30.000 | −1.53126 | (quartz) | $L_{21}$ |
| 15 | 900.000 | −481.784 | −1.0000 | | |
| 16 | −257.121 | −35.000 | −1.48295 | (quartz) | $L_{31}$ |
| 17 | −306.348 | −34.164 | −1.0000 | | |
| 18 | −238.821 | −15.000 | −1.53126 | (quartz) | $L_{32}$ |
| 19 | −202.203 | −24.613 | −1.0000 | | |
| 20 | −94514.655 | −14.817 | −1.53126 | (quartz) | $L_{33}$ |
| 21 | 1000.000 | −965.156 | −1.0000 | | |
| 22 | 1192.217 | 800.500 | 1.0000 | | $M_2$ |
| 23 | 239.014 | 13.881 | 1.48295 | (fluorite) | $L_{41}$ |
| 24 | 701.943 | 14.547 | 1.0000 | | |
| 25 | −221.419 | 40.000 | 1.48295 | (quartz) | $L_{42}$ |
| 26 | −252.472 | 0.500 | 1.0000 | | |
| 27 | 138.449 | 40.079 | 1.48295 | (fluorite) | $L_{43}$ |
| 28 | −253.108 | 0.500 | 1.0000 | | |
| 29 | −249.340 | 21.997 | 1.53126 | (quartz) | $L_{44}$ |
| 30 | 313.176 | 0.499 | 1.0000 | | |
| 31 | 335.839 | 13.623 | 1.48295 | (fluorite) | $L_{45}$ |
| 32 | 22383.397 | 0.500 | 1.0000 | | |
| 33 | 94.117 | 45.000 | 1.53126 | (quartz) | $L_{46}$ |
| 34 | 63.412 | 4.289 | 1.0000 | | |
| 35 | 79.601 | 40.000 | 1.48295 | (fluorite) | $L_{47}$ |
| 36 | 775.688 | 26.439 | 1.0000 | | |

<Condition Corresponding Values>

$\beta_{M1} = -0.828$
$\beta_{M2} = -2.242$
$\beta_{G4} = 0.120$

Figure 24:
FIG. 24 is a graph showing the coma aberration of the 14th embodiment.

FIG. 24 shows coma for explaining the imaging performance of the 14th embodiment. FIG. 24 shows coma in the meridional and sagittal directions at the center of the ring-shaped view field. A broken curve represents coma at 213 nm, a solid curve represents coma at 217 nm, and a dotted curve represents coma at 221 nm. As can be seen from FIG. 24, the catadioptric reduction projection optical system of the 14th embodiment performs correction of aberration within this range, and has an excellent imaging performance.

Figure 25:
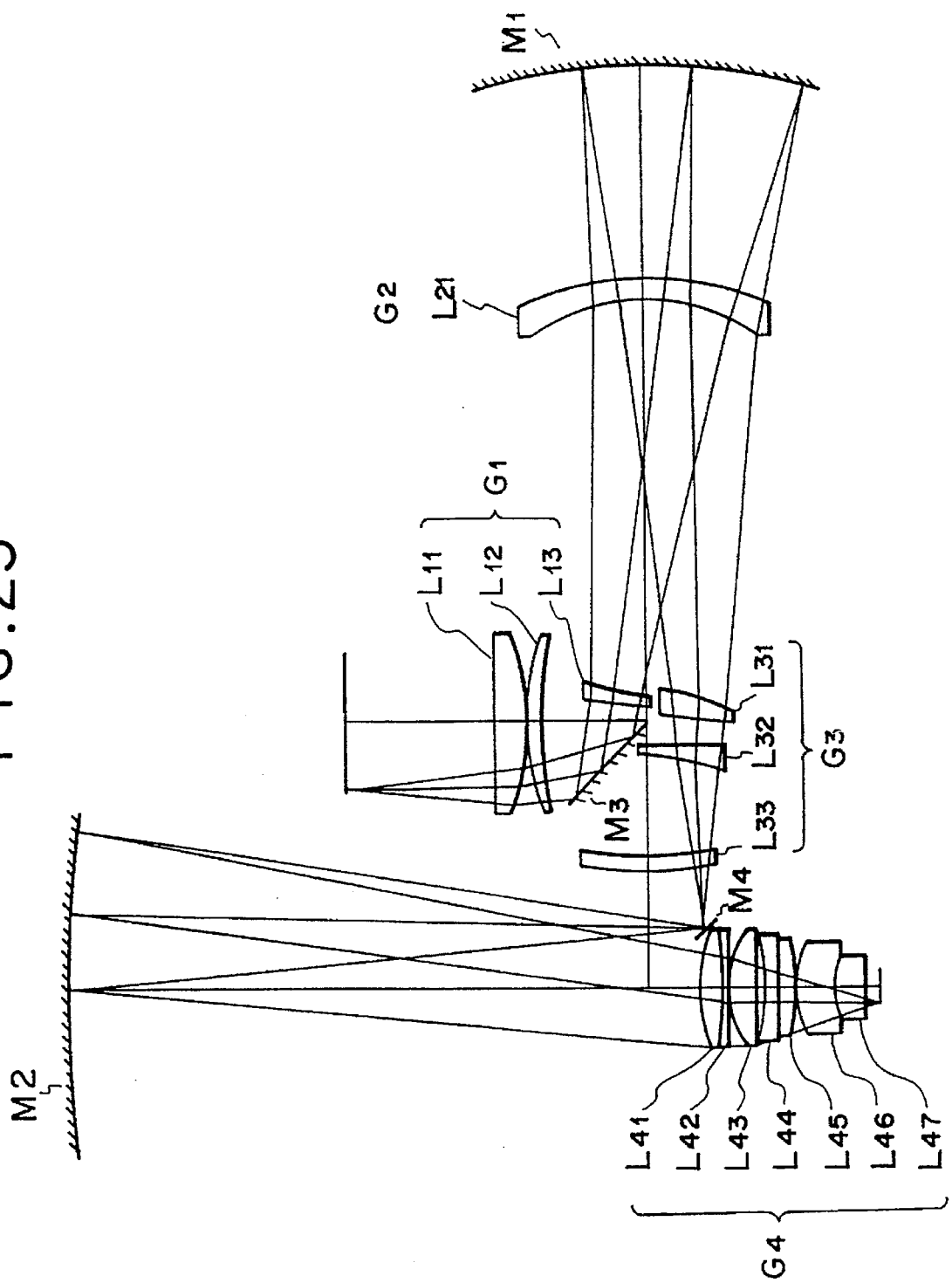
FIG. 25 shows a light path of a 15th embodiment of a catadioptric reduction projection optical system of the present invention.

The 15th embodiment will be described below with reference to FIG. 25. FIG. 25 shows a light path showing a 15th embodiment of the present invention. As shown in FIG. 25, a light beam from the object surface passes through a first lens group $G_1$ of positive refractive power, and its light path is bent by a planar reflection mirror $M_3$. The light beam passes through a second lens group $G_2$ and is reflected by a first concave reflection mirror $M_1$ having a magnification slightly smaller than unity magnification. The first lens group $G_1$ comprises a plano-convex positive lens $L_{11}$ having a planar surface facing the object surface, a positive meniscus lens $L_{12}$ having a convex surface facing the object side, and a negative meniscus lens $L_{13}$ having a convex surface facing the object side. The planar reflection mirror $M_3$ is disposed between the positive meniscus lens $L_{12}$ and the negative meniscus lens $L_{13}$.

The second lens group $G_2$ is disposed between the first lens group $G_1$ and the first concave reflection mirror $M_1$, and comprises a negative meniscus lens $L_{21}$ having a convex surface facing the first concave reflection mirror $M_1$ side.

The first lens group $G_1$ mainly functions to correct distortion and to maintain telecentric characteristics. The second lens group $G_2$ mainly functions to correct come of high orders generated by the first and second concave reflection mirrors $M_1$ and $M_2$. The light beam reflected by the first concave reflection mirror $M_1$ passes through a third lens group $G_3$ via the second lens group $G_2$ to form a primary reduced image $I_1$.

The third lens group $G_3$ comprises a positive meniscus lens $L_{31}$ having a convex surface facing the first concave reflection mirror side, a negative almost plano-concave lens $L_{32}$ having a concave surface facing the primary image $I_1$ side, and a positive meniscus lens $L_{33}$ of weak refractive power having a convex surface facing the primary image $I_1$ side. The third lens group $G_3$ functions to correct distortion and curvature of field, and functions as a field lens.

After the light path of the light beam is bent by a planar reflection mirror $M_4$, the light beam emerging from the third lens group $G_3$ is reflected by the second concave reflection mirror $M_2$ and is incident on a fourth lens group $G_4$ of positive refractive power. The fourth lens group $G_4$ comprises, in succession from the incident side of a light beam, a biconvex lens $L_{41}$, a biconcave lens $L_{42}$, a positive meniscus lens $L_{43}$ having a convex surface facing the second concave reflection mirror $M_2$ side, a biconcave lens $L_{44}$, a biconvex lens $L_{45}$, a negative meniscus lens $L_{46}$ having a convex surface facing the second concave reflection mirror $M_2$ side, and a positive meniscus lens $L_{47}$ having a convex surface facing the second concave reflection mirror $M_2$ side.

The fourth lens group $G_4$ forms a secondary image $I_2$ in a larger reduction scale than that of the primary image $I_1$. At this time, only part of each of the negative meniscus lens $L_{13}$ in the first lens group $G_1$, the planar reflection mirror $M_3$, and the positive meniscus lens $L_{31}$ and the negative almost plano-concave lens $L_{32}$ in the third lens group $G_3$ is used so as not to shield opposing light paths.

The 15th embodiment has a reduction factor of 0.25 or ¼ as a whole, and achieves a numerical aperture (N.A.) of 0.45 in a ring-shaped view field centered on a wafer having a radius of 20 mm from the optical axis. The center and spread of wavelengths of a light source used for illumination are $\lambda = 217 \pm 4$ nm.

Data of the 15th embodiment are shown in Table 15 below.

In Table 15, signs of the refractive index and the plane-to-plane distance are inverted by the reflection by the concave reflection mirror. The refractive index of each glass material corresponds to that at the center wavelength (217 nm). The positions of the planar reflection mirrors $M_3$ and $M_4$ for bending an optical path are omitted since they are not essential in the optical design.

TABLE 15

Data of 15th Embodiment

| No. | Radius of Curvature | Plane-to-Plane Distance | Refractive Index | | |
|---|---|---|---|---|---|
| | (Object Surface) | 183.527 | 1.0000 | | |
| 1 | ∞ | 37.138 | 1.53126 | (quartz) | $L_{11}$ |
| 2 | −339.043 | 0.500 | 1.0000 | | |
| 3 | 256.545 | 17.073 | 1.53126 | (quartz) | $L_{12}$ |
| 4 | 429.175 | 155.427 | 1.0000 | | |
| 5 | 314.370 | 15.000 | 1.53126 | (quartz) | $L_{13}$ |
| 6 | 154.417 | 504.109 | 1.0000 | | |
| 7 | −236.577 | 20.000 | 1.48295 | (fluorite) | $L_{21}$ |
| 8 | −369.351 | 266.233 | 1.0000 | | |
| 9 | −799.568 | −266.233 | −1.0000 | | $M_1$ |
| 10 | −369.351 | −20.000 | −1.48295 | (fluorite) | $L_{21}$ |
| 11 | −236.577 | −491.460 | −1.0000 | | |
| 12 | −216.826 | −35.000 | −1.53126 | (quartz) | $L_{31}$ |
| 13 | −536.198 | −34.164 | −1.0000 | | |
| 14 | −1123.930 | −15.000 | −1.48295 | (fluorite) | $L_{32}$ |
| 15 | −199.354 | −199.805 | −1.0000 | | |
| 16 | 1488.012 | −21.214 | −1.53126 | (quartz) | $L_{33}$ |
| 17 | 1000.000 | −880.000 | −1.0000 | | |
| 18 | 1143.371 | 802.383 | 1.0000 | | $M_2$ |
| 19 | 222.215 | 22.128 | 1.48295 | (fluorite) | $L_{41}$ |
| 20 | −929.491 | 0.500 | 1.0000 | | |
| 21 | −1000.000 | 7.500 | 1.53126 | (quartz) | $L_{42}$ |
| 22 | 1221.490 | 0.500 | 1.0000 | | |
| 23 | 116.974 | 36.073 | 1.48295 | (fluorite) | $L_{43}$ |
| 24 | 1474.680 | 7.516 | 1.0000 | | |
| 25 | −407.993 | 19.063 | 1.53126 | (quartz) | $L_{44}$ |
| 26 | 852.730 | 0.782 | 1.0000 | | |
| 27 | 1302.010 | 19.232 | 1.48295 | (fluorite) | $L_{45}$ |
| 28 | −376.270 | 0.500 | 1.0000 | | |
| 29 | 145.377 | 45.000 | 1.53126 | (quartz) | $L_{46}$ |
| 30 | 66.088 | 1.158 | 1.0000 | | |
| 31 | 71.786 | 40.000 | 1.48295 | (fluorite) | $L_{47}$ |
| 32 | 2939.734 | 15.769 | 1.000 | | |

<Condition Corresponding Values>

$\beta_{M1} = -0.988$
$\beta_{M2} = -2.008$
$\beta_{G4} = 0.142$

Figure 26:
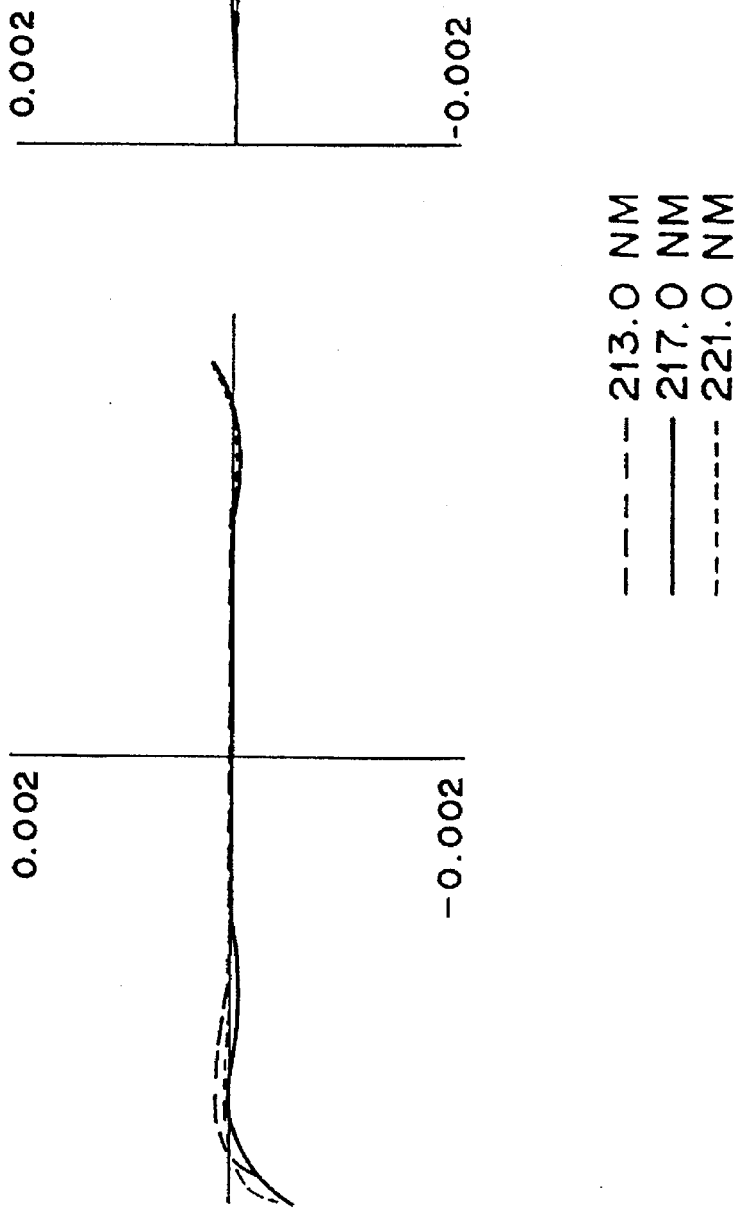
FIG. 26 is a graph showing the coma aberration of the 15th embodiment.

FIG. 26 shows coma for explaining the imaging performance of the 15th embodiment. FIG. 26 shows coma in the meridional and sagittal directions at the center of the ring-shaped view field. A broken curve represents coma at 213 nm, a solid curve represents coma at 217 nm, and a dotted curve represents coma at 221 nm. As can be seen from FIG. 26, the catadioptric reduction projection optical system of the 15th embodiment performs correction of aberration within this range, and has an excellent imaging performance.

In accordance with the present invention, the catadioptric reduction projection optical system which is simpler in construction than the prior art optical system, and has a larger numerical aperture, a better image-forming ability and a wider illumination field or a wider exposure field is provided. In spite of the large numerical aperture and the wide exposure field, the plane accuracy and the allowance of eccentricity are less severe because of smaller size of the optical elements. Accordingly, it is very useful for a projection optical system for fabricating a semiconductor device.

What is claimed is:

1. A catadioptric reduction projection optical system for forming a reduced image of an object, comprising in a light path sequence from the object;

a first partial optical system including a first group of lenses having a positive refractive power, a first concave reflection mirror and a second group of lenses having a positive refractive power, for forming a primary reduced image of the object;

a second partial optical system including a second concave reflection mirror and a third group of lenses having a positive refractive power, for further reducing the primary reduced image to refocus the image; and a reflection mirror arranged in a light path between said first partial optical system and said second partial optical system for deflecting the optical path.

2. A catadioptric reduction projection optical system according to claim 1, wherein said first concave reflection mirror has a reduction magnification and said second concave reflection mirror has an enlargement magnification.

3. A catadioptric reduction projection optical system according to claim 1, wherein a magnification β of said second concave reflection mirror $M_2$ meets a condition of:

$$-2.5 < \beta_{M2} < -0.7.$$

4. A catadioptric reduction projection optical system according to claim 1, wherein a magnification β said first concave reflection mirror meets a condition of:

$$-2.0 < \beta_{M1} < -0.3.$$

5. A catadioptric reduction projection optical system according to claim 1, wherein said first group of lenses is arranged in the vicinity of the object functions as a field lens and corrects distortion aberration, and said second group of lenses and said third group of lenses contribute to the formation of the reduced image and function to correct a Petzval sum.

6. A catadioptric reduction projection optical system according to claim 1, wherein said first concave reflection mirror and said second concave reflection mirror are spherical mirrors, and said second partial optical system has a fourth group of lenses between said second concave reflection mirror and said third group of lenses.

7. A catadioptric reduction projection optical system according to claim 6, wherein said first group of lenses of said first partial optical system includes a biconvex positive lens and a negative meniscus lens having a convex surface thereof facing the object, said second group of lenses includes a negative meniscus lens having a convex surface thereof faced to said first concave reflection mirror and a positive lens having a stronger radius of curvature on a surface facing said first concave reflection mirror, and said third group of lenses of said second partial optical system includes a positive lens having a stronger radius of curvature on a surface facing said second concave reflection mirror, a meniscus lens having a convex surface thereof facing said second concave reflection mirror and a positive lens having a stronger radius of curvature on a surface facing said second concave reflection mirror.

8. A catadioptric reduction projection optical system according to claim 6, wherein said first partial optical system has a fifth group of lenses including a meniscus lens having a convex surface thereof facing said first concave reflection mirror.

9. A catadioptric reduction projection optical system according to claim 8, wherein said first group of lenses includes a biconvex positive lens, a meniscus lens having a concave surface thereof facing the object and a meniscus lens having a convex surface thereof facing the object.

10. A catadioptric reduction projection optical system for forming a reduced image of an object, including:

a first partial optical system having first reflecting means and first refracting means to condense a light beam from the object and form a reduced primary image; and a second partial optical system having second reflecting means and second refracting means to form a further reduced secondary image from said primary image;

said first reflecting means having only one concave reflecting mirror, said first refracting means having a lens group of positive refractive power disposed between said object and said concave reflecting mirror;

said second reflecting means having only one concave reflecting mirror, said second refracting means having a lens group of positive refractive power disposed between said concave reflecting mirror of said second partial optical system and said second secondary image.

11. A catadioptric reduction projection optical system according to claim 10, wherein negative Petzval sum created in the concave reflecting mirror of said first partial optical system and the concave reflecting mirror of said second partial optical system is corrected by positive Petzval sum created by the first refracting means of said first partial optical system and the second refracting means of said second partial optical system.

12. A catadioptric reduction projection optical system according to claim 11, wherein a magnification $\beta_{M2}$ of the concave reflecting mirror of said second partial optical system meets a condition of:

$$-2.5<\beta_{M2}<-0.7.$$

13. A catadioptric reduction projection optical system according to claim 11, wherein a magnification $\beta_{M1}$ of the concave reflecting mirror of said first partial optical system meets a condition of:

$$-2.0<\beta_{M1}<-0.3.$$

14. A catadioptric reduction projection optical system according to claim 11, further including a plane reflecting member disposed between the concave reflecting mirror of said first partial optical system and the concave reflecting mirror of said second partial optical system for bending the optical path.

15. A catadioptric reduction projection optical system according to claim 10, wherein the concave reflecting mirror of said first partial optical system has a reduction magnification, and the concave reflecting mirror of said second partial optical system has an enlargement magnification.

16. A catadioptric reduction projection optical system for forming a reduced image of an object comprising, in succession from an object side:

a first partial optical system including, in succession from the object side, a first lens group of positive refractive power, and a first concave reflection mirror, for forming a primary image of the object; and a second partial optical system including, in succession from the object side, a second lens group, a second concave reflection mirror, and a third lens group of positive refractive power, for re-imaging the primary image.

17. A system according to claim 16, wherein said third lens group is constituted to satisfy:

$$0.05<\beta_{G3}<0.6$$

where $\beta_{G3}$ is the magnification of said third lens group.

18. A system according to claim 16, wherein said first concave reflection mirror is constituted to satisfy:

$$-2.0<\beta_{M1}<-0.7$$

where $\beta_{M1}$ is a magnification of said first concave reflection mirror.

19. A system according to claim 16, wherein said second concave reflection mirror is constituted to satisfy:

$$-2.5<\beta_{M2}<-0.7$$

where $\beta_{M2}$ is a magnification of said second concave reflection mirror.

20. A system according to claim 16, wherein at least one of said first to third lens groups is constituted by at least two different optical materials, thereby correcting chromatic aberration.

21. A system according to claim 20, wherein the optical materials include quartz glass and fluorite.

22. A system according to claim 16, further including at least two reflection mirrors arranged in light paths of said first and second partial optical systems, thereby making an object surface parallel to an image surface.

23. A system according to claim 22, wherein one of said at least two reflection mirrors is arranged in the light path of said first partial optical system, and the other of said at least two reflection mirrors is arranged in the light path of said second partial optical system.

24. A system according to claim 16, wherein at least one of said first and second concave reflection mirrors has a non-spherical reflection surface.

25. A catadioptric reduction projection optical system for forming a reduced image of an object, comprising:

a first partial optical system for forming a primary image of the object; and a second partial optical system for forming a secondary image of the object based on light from the primary image, said first partial optical system having a first lens group of positive refractive power, a second lens group of negative refractive power, and a first concave reflection mirror in succession from a light incident side, and said second partial optical system having a second concave reflection mirror, and a fourth lens group of positive refractive power, wherein a third lens group is disposed in a light path between said first concave reflection mirror and said second concave reflection mirror, said first to fourth lens groups consist of at least one material selected from a group consisting of quartz glass and fluorite, and a magnification $\beta_{M1}$ of said first concave reflection mirror and a magnification $\beta_{M2}$ of said second concave reflection mirror meet conditions of:

$$-1.0<\beta_{M1}<-0.7$$

$$-2.5<\beta_{M2}<-1.2.$$

26. A system according to claim 25, wherein a magnification $\beta_{G4}$ of said fourth lens group meets a condition of:

$$0.05<\beta_{G4}<0.3.$$

27. A system according to claim 26, wherein said third lens group has at least one positive lens consisting of quartz glass and at least one negative lens consisting of fluorite, and said fourth lens group has at least two positive lenses consisting of fluorite and at least one negative lens consisting of quartz glass.

28. A system according to claim 26, wherein said second lens group is constituted by a single lens of negative refractive power, and a glass material of said single lens is fluorite.

* * * * *